United States Patent
Kubo et al.

(10) Patent No.: US 7,271,068 B2
(45) Date of Patent: Sep. 18, 2007

(54) METHOD OF MANUFACTURE OF SEMICONDUCTOR DEVICE

(75) Inventors: Sakae Kubo, Takasaki (JP); Yoshito Nakazawa, Isesaki (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/144,623

(22) Filed: Jun. 6, 2005

(65) Prior Publication Data
US 2005/0287732 A1 Dec. 29, 2005

(30) Foreign Application Priority Data
Jun. 25, 2004 (JP) .............................. 2004-188290

(51) Int. Cl.
*H01L 21/8238* (2006.01)

(52) U.S. Cl. ...................... 438/270; 438/233; 438/275; 438/294; 257/E21.384; 257/E21.419; 257/E21.428; 257/E29.02

(58) Field of Classification Search ................ 438/197, 438/186, FOR. 160, 207, 233, 275, 294, 438/430, 428, 206, 209, 259, 270, 272, FOR. 177, 438/FOR. 180; 257/330, 335, 329, E29.02, 257/E21.206, E21.574, E21.545, E21.556, 257/E21.384, E21.419, E21.428, E21.43, 257/E21.409
See application file for complete search history.

(56) References Cited

U.S. PATENT DOCUMENTS

| | | | | |
|---|---|---|---|---|
| 5,282,018 A | * | 1/1994 | Hiraki et al. ................ 257/296 |
| 5,614,751 A | * | 3/1997 | Yilmaz et al. .............. 257/394 |
| 6,177,704 B1 | * | 1/2001 | Suzuki et al. ............... 257/343 |
| 2002/0119639 A1 | * | 8/2002 | Ridley et al. ............... 438/428 |
| 2004/0262678 A1 | * | 12/2004 | Nakazawa et al. .......... 257/330 |
| 2005/0029584 A1 | * | 2/2005 | Shiraishi et al. ............ 257/329 |

FOREIGN PATENT DOCUMENTS

JP 2002-368221 12/2002

* cited by examiner

*Primary Examiner*—Michelle Estrada
*Assistant Examiner*—Quovaunda Jefferson
(74) *Attorney, Agent, or Firm*—Antonelli, Terry, Stout & Kraus, LLP.

(57) ABSTRACT

A power MISFET, which has a desired gate breakdown voltage, can be manufactured will controlling an increase in parasitic capacitance. After depositing a polycrystalline silicon film on a substrate and embedding groove portions in the polycrystalline silicon film by patterning the polycrystalline silicon film in an active cell area, a gate electrode is formed within the groove portion, and the inside of the groove portion is embedded in a gate wiring area. Extending to the outside of the groove portion continuously out of the groove portion, there is a gate drawing electrode electrically connected to the gate electrode. Slits extending from the end portion of the gate drawing electrode are formed in the gate drawing electrode outside of the groove portion. Then, a silicon oxide film and a BPSG film are deposited on the substrate.

10 Claims, 22 Drawing Sheets

METHOD OF MANUFACTURE OF SEMICONDUCTOR DEVICE

CROSS-REFERENCE TO RELATED APPLICATION

The present application claims priority from Japanese patent application No. 2004-188290, filed on Jun. 25, 2004, the content of which is hereby incorporated by reference into this application.

BACKGROUND OF THE INVENTION

The present invention especially relates to technology which is applicable to the manufacture of a semiconductor device which has a power MISFET (Metal Insulator Semiconductor Field Effect Transistor).

For example, in a semiconductor device which has a vertical type is MOSFET (Metal Oxide Semiconductor Field Effect Transistor), there is technology which can improve the isolation voltage of this type of MOSFET, in which a gate electrode is formed in the inside of a groove formed in the surface of a semiconductor substrate, and an interlayer insulation film is formed on the semiconductor substrate under the gate electrode. A contact hole, which reaches the gate electrode, is formed in the interlayer insulation film. The inside of the contact hole is filled with an electric conductor plug, which connects to the gate electrode electrically, and wiring formed on the interlayer insulation film is electrically connected to the gate electrode via the electric conductor plug.

[Patent Reference 1] Japanese Unexamined Patent Publication No. 2002-368221.

SUMMARY OF THE INVENTION

A transistor of the type which may be subjected to large electric power use and which can withstand electric power of several watts or more is called a power transistor, and various structures thereof will be examined. There are some structures which are especially called a vertical type and a width type in a power MISFET, and these devices are further classified into structures, such as a trench (groove) gate type and a planar gate type, according to the structure of the gate portion. In such a power MISFET, in order to obtain a large electric power, a structure in which many (for example, tens of thousands) MISFET(s) of the detailed pattern are connected in parallel, for example is adopted.

The inventors have examined technology for reducing the ON resistance of a power MISFET. By reducing the ON resistance, a large current can be obtained. The inventors have also examined technology which miniaturizes the semiconductor chip (hereafter simply described as a chip) in which a power MISFET is formed.

In order to reduce the ON resistance, it is necessary to lengthen the channel width per unit area. Thus, the inventors have examined technology which lengthens the channel width per unit area by adopting a trench gate type structure and making the width of the groove in which a gate portion is formed smaller. By narrowing the width of the groove, miniaturization of a chip also becomes realizable, and further miniaturization of a chip also becomes realizable by making the interval between adjoining grooves as narrow as possible.

In the manufacture of a power MISFET having the above-mentioned trench gate type structure, the inventors have found that the following problems exist.

That is, the process of manufacture of a power MISFET of the trench gate type, which the inventors have examined, includes the following steps. First, as shown in FIG. 21, after forming grooves 102 and 103 in the main surface (element formation surface) of a semiconductor substrate (hereafter simply described as a substrate) 101, a gate electrode 104 is formed in each groove 102, and a gate wiring 105 is formed in the groove 103. Gate electrode 104 and gate wiring 105 are formed in one step, and a part of the gate wiring 105 is patterned so that it may extend to the outside of the groove 103. Then, an interlayer insulation film 106 is deposited on the substrate 101. Since interlayer insulation film 106 becomes embedded in the grooves 102 on the gate electrodes 104 in the cell region in which gate electrodes 104 are formed, the film thickness TC in a cell region becomes thin compared with the film thickness TL in the other region. When patterning the interlayer insulation film 106, the interlayer insulation film 106 on the cell region (except for the inside of the grooves 102) is removed, and an opening 107 which reaches the gate wiring 105 is formed in interlayer insulation film 106 on the gate wiring 105 extending out of groove 103 (refer to FIG. 22). The interlayer insulation film 106 which remains in the grooves 102 serves to insulate the wiring that is formed in the upper part of the grooves 102 at a later step, as well as the gate electrodes 104. Since the film thickness TC in the cell region is thin compared with the film thickness TL in the other region at this time, if the interlayer insulation film 106 is etched until opening 107 opens completely, a problem occurs in that over-etching of the film thickness TG of the interlayer insulation film 106, which remains in the grooves 102, will be carried out, leaving an amount which is inadequate for maintaining a desired gate breakdown voltage. On the contrary, if a sufficient film thickness TG to maintain the desired gate breakdown voltage of the interlayer insulation film 106 remains in the grooves 102, the problem of the opening 107 not reaching the gate wiring 105 exists.

In an effort to solve the above-mentioned problems, the inventors made the upper surface of the gate electrode 104 low, and examined ways to secure enough of the film thickness of the interlayer insulation film 106 which remains in groove 102. However, if the upper surface of the gate electrode 104 is made low in the depth direction of groove 102, it will be necessary to make the source (semiconductor layer 110) deep. Since the punch through voltage will fall if the source (semiconductor layer 110) is made deep, it will be necessary to also make the channel (semiconductor layer 108) deep. If the channel (semiconductor layer 108) is made deep, it is necessary to also make groove 102, which pierces through it, deep. Since the parasitic capacitance between the gate and the source increases when the groove 102 becomes deep, a problem occurs in that the switching loss will increase. Since the depth variation will increase compared with the case the groove of being shallow, if the groove 102 is made deep, the portion which runs through semiconductor layer 108, that is used as the channel of the power MISFET, and which reaches semiconductor layer 109, that is used as a drain among grooves 102, increases. This results in problems in that the parasitic capacitance between the gate and the drain produced between gate electrode 104 and semiconductor layer 109 increases, and the switching loss of the power MISFET increases. In order to deeply form the semiconductor layer 110, which is used as the source of the power MISFET, and the semiconductor layer 108, the time which the heat treatment for diffusing the impurities which form semiconductor layer 110 and semiconductor layer 108 takes increases, and a problem results in that the TAT (Turn Around Time) in the manufacture of the semiconductor device will increase. Since groove 102 must be formed deeply, problems arise in that controlling the form of groove 102 becomes difficult, the time which etching takes will increase, and the TAT (Turn Around Time) in the manufacture of a semiconductor device will increase.

An object of the present invention is to provide a technology on the basis of which a power MISFET, which has a desired gate breakdown voltage, can be manufactured, while controlling an increase in the parasitic capacitance.

Another object of the present invention is to provide a technology on the basis of which a power MISFET having an improved reliability can be manufactured.

The above and other objects and new features of the present invention will become clear from the following description and the accompanying drawings.

An outline of typical aspects and features of the invention will be briefly explained.

A method of manufacture of a semiconductor device according to the present invention comprises the steps of:

(a) forming a first semiconductor layer of a first electric conduction type on a main surface of a semiconductor substrate of the first electric conduction type;

(b) forming a second semiconductor layer of a second electric conduction type by introducing impurities of the second electric conduction type having a polarity contrary to the first electric conduction type into the semiconductor substrate;

(c) in the main surface of the semiconductor substrate, forming a first groove portion that penetrates the second semiconductor layer in a first area, and forming a second groove portion that penetrates the second semiconductor layer in a second area;

(d) forming a first insulation film in the first groove portion and in the second groove portion;

(e) forming a first conductivity film over the semiconductor substrate under existence of the first insulation film, and embedding the first groove portion and the second groove portion by the first conductivity film;

(f) patterning the first conductivity film, by removing the first conductivity film being out of the first groove portion, and the first conductivity film only for the first depth from an opening of the first groove portion in the first area, leaving the first conductivity film which embeds the second groove portion and extends and exists in a determined amount out of the second groove in the second area, and forming a third groove portion in the first conductivity film extending and existing out of the second groove portion in the second area;

(g) forming a third semiconductor layer of the first electric conduction type in the second semiconductor layer which adjoins the first groove portion by introducing impurities of the first electric conduction type into the second semiconductor layer of the first area;

(h) after the step (f), forming a second insulation film which embeds the first groove portion over the semiconductor substrate;

(i) patterning the second insulation film, by removing the second insulation film being out of the first groove portion in the first area, and forming a first opening that reaches the first conductivity film extending and existing out of the second groove portion in the second insulation film in the second area; and (j) after the step (i), forming a first wiring electrically connected to the third semiconductor layer over the semiconductor substrate of the first area, and forming a second wiring electrically connected to the first conductivity film under the first opening over the semiconductor substrate of the second area;

wherein in the first area, the first semiconductor layer is a drain, the second semiconductor layer is a channel, and the third semiconductor layer is a source.

An effect attained by typical aspects and features of the invention indicated in the present application will be explained briefly.

That is, a power MISFET, which has a desired gate breakdown voltage, can be manufactured, while controlling an increase in the parasitic capacitance. Since the interlayer insulation film formed on a gate electrode can be formed to have a film thickness which secures sufficient gate breakdown voltage, the reliability of a power MISFET can be improved.

DETAILED DESCRIPTION OF THE PREFERRED EMBODIMENTS

Hereafter, various embodiments of the present invention will be explained in detail based on the accompanying drawings. In all of the drawings, the same reference designation will be given to members having the same functions, and a repeated description thereof will be omitted. In some of the drawings, in order to make the spatial relationship of a member intelligible, even if it is a plan view, hatching may be employed.

Embodiment 1

The semiconductor device of Embodiment 1 is a trench gate type power MISFET of the p channel type, for example. The method of manufacture of the semiconductor device of Embodiment 1 will be explained in the order of the steps thereof with reference to FIGS. 1 to 14.

Figure 1:
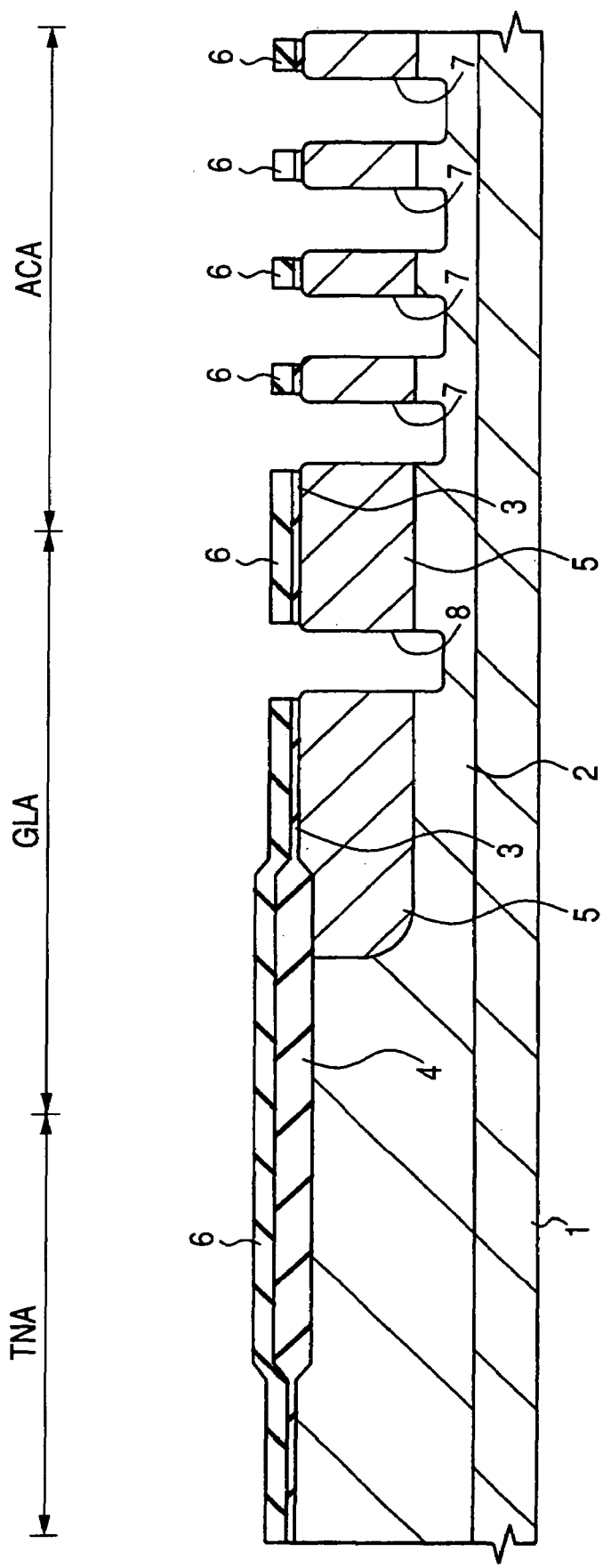
FIG. 1 is a sectional view showing a step in the method of manufacture of a semiconductor device representing an Embodiment 1 of the present invention.

First, a p-type single-crystal-silicon layer (first semiconductor layer) 2, having a low concentration, is epitaxially grown on a $p^+$ type single-crystal-silicon substrate 1, in which p type impurities (for example, B (boron)) have been doped. In this regard, on the surface (main surface) of $p^+$ type single-crystal-silicon substrate 1, p type (first electric conduction type) impurities (for example, B) are introduced with a high concentration to form the first semiconductor layer 2, as shown in FIG. 1. This substrate has an active cell area (the first area) ACA, in which an active cell containing a gate electrode, a source, a drain, etc. of the power MISFET will be formed at a later step, a gate wiring area (the second area) GLA, in which wiring electrically connected to the gate electrode of the power MISFET is formed, and a termination area TNA, in which a girdling area is formed. The $p^+$ type single-crystal-silicon substrate 1 and the p-type single-crystal-silicon layer 2 serve as a drain area of the power MISFET at a later step. Then, a silicon oxide film 3 is formed by performing thermal oxidation of the surface (main surface) of the p-type single-crystal-silicon layer 2, for example.

Next, after depositing a silicon nitride film (illustration is omitted) on the silicon oxide film 3, the silicon nitride film is patterned by etching the silicon nitride film, using as a mask a photoresist film (illustration being omitted) patterned by photo lithography technology. Then, a field insulation film 4 is formed by applying thermal oxidation processing to the substrate.

Next, n type (the second electric conduction type) impurities (for example, P (phosphorus)) are introduced into the p-type single-crystal-silicon layer 2, using as a mask a photoresist film (illustration being omitted) patterned by photo lithography technology. Then, an n-type semiconductor area (the second semiconductor layer) 5 is formed by application of heat-treatment to the substrate. The n-type semiconductor area 5 formed in active cell area ACA, in which a gate electrode is formed at a later step, becomes a channel area of the power MISFET of the Embodiment 1.

Next, after depositing a silicon oxide film 6 on the substrate, by etching the silicon oxide film 6 and the silicon oxide film 3, using as a mask a photoresist film (illustration being omitted) patterned by photo lithography technology, the silicon oxide film 6 and silicon oxide film 3 are patterned. Then, by etching the substrate using the silicon oxide film 6 and silicon oxide film 3 as a mask, groove portions (the first groove portion) 7 are formed in active cell area ACA, and a groove portion (the second groove portion) 8 is formed in gate wiring area GLA. The groove portions 7 are formed so that two or more grooves may be arranged in the section (the first section) in parallel along a direction which intersects the direction (the first direction) at which the groove portions 7 extend.

Figure 2:
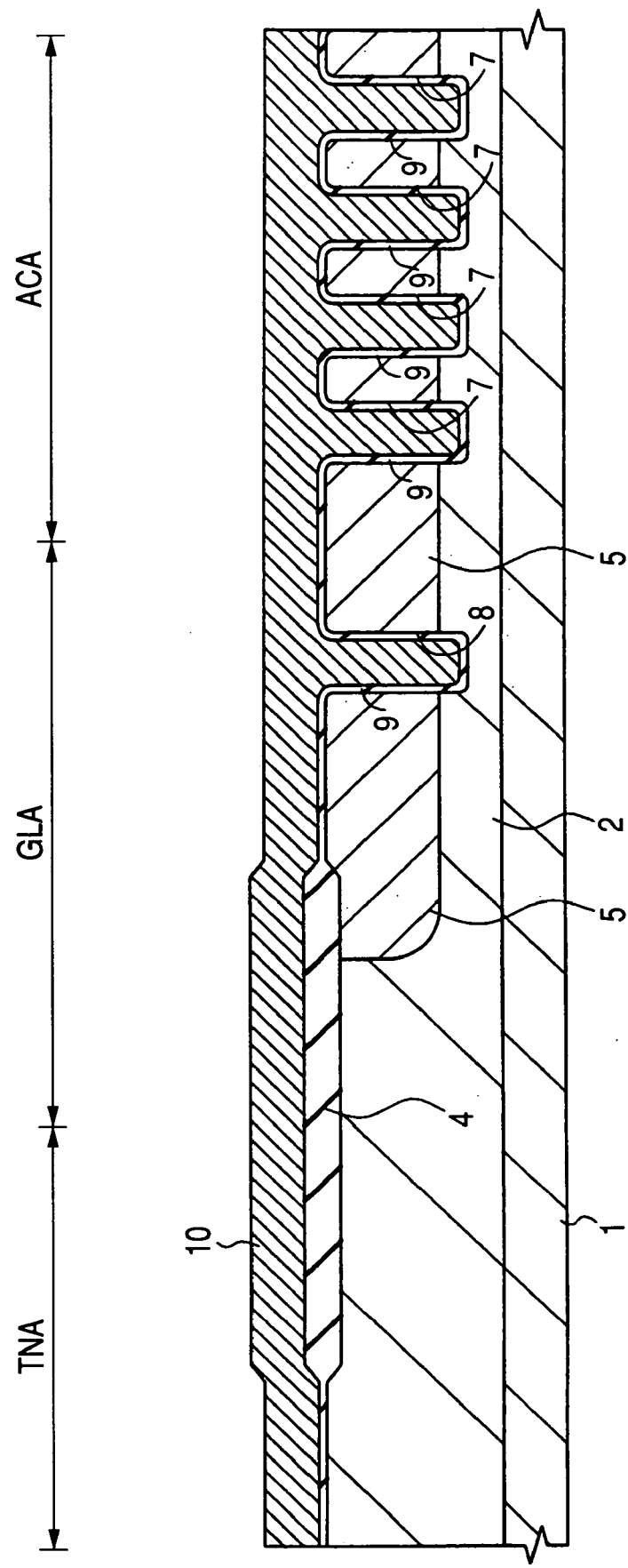
FIG. 2 is a sectional view showing a step in the process of manufacture of the semiconductor device following the step shown in FIG. 1.

Next, after removing the silicon oxide films 6 and 3 by etching, as shown in FIG. 2, a gate oxide film (the first insulation film) 9, of about 70 nm in film thickness, is formed by performing thermal oxidation processing on the substrate. Then, a polycrystalline silicon film (the first conductivity film) 10 is deposited on the substrate by CVD (Chemical Vapor Deposition), and groove portions 7 and 8 are embedded by the polycrystalline silicon film 10. Subsequently, B (boron) is introduced into the polycrystalline silicon film 10, for example.

Figure 3:
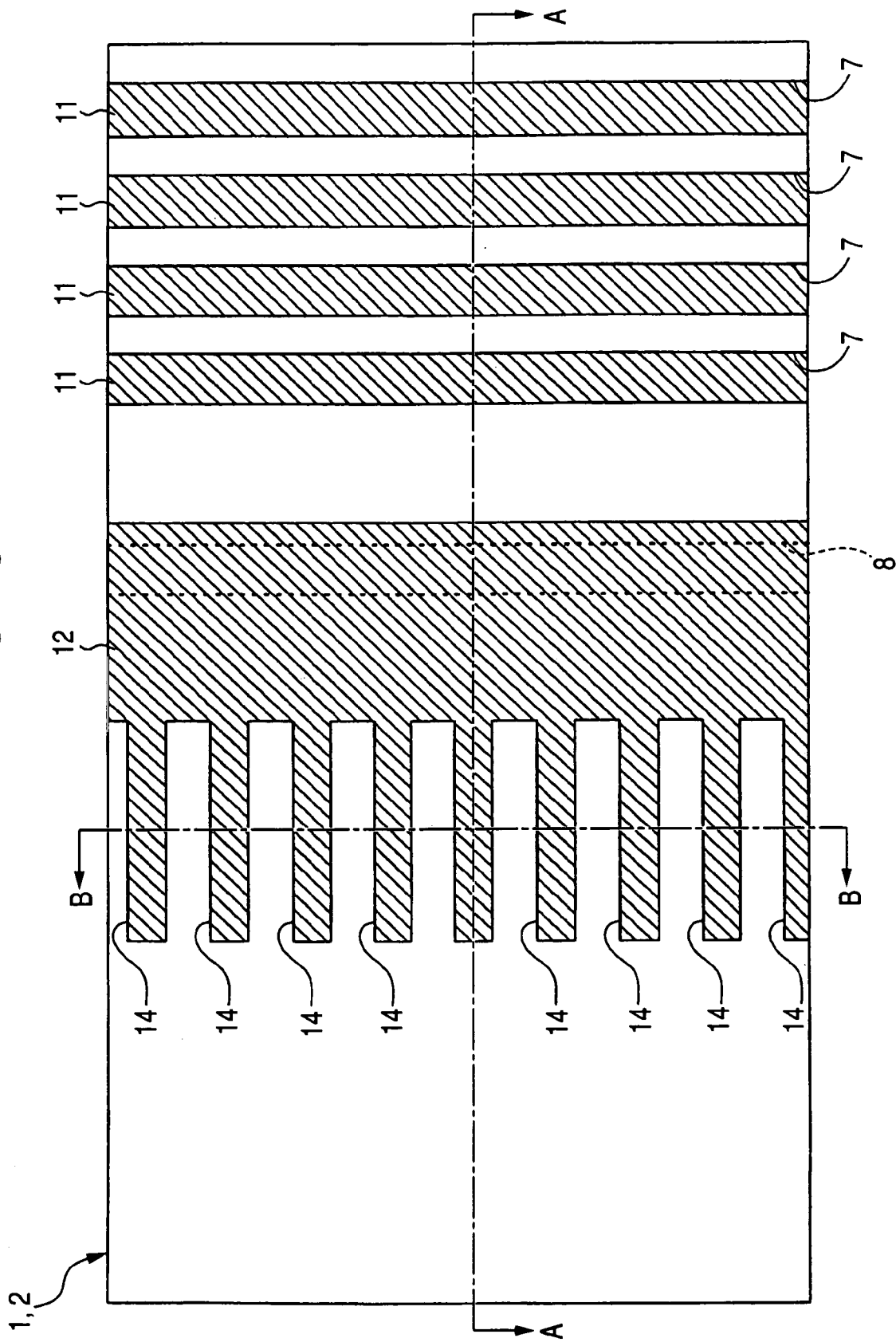
FIG. 3 is a plan view showing a step in the process of manufacture of the semiconductor device following the step shown in FIG. 2.
Figure 4:
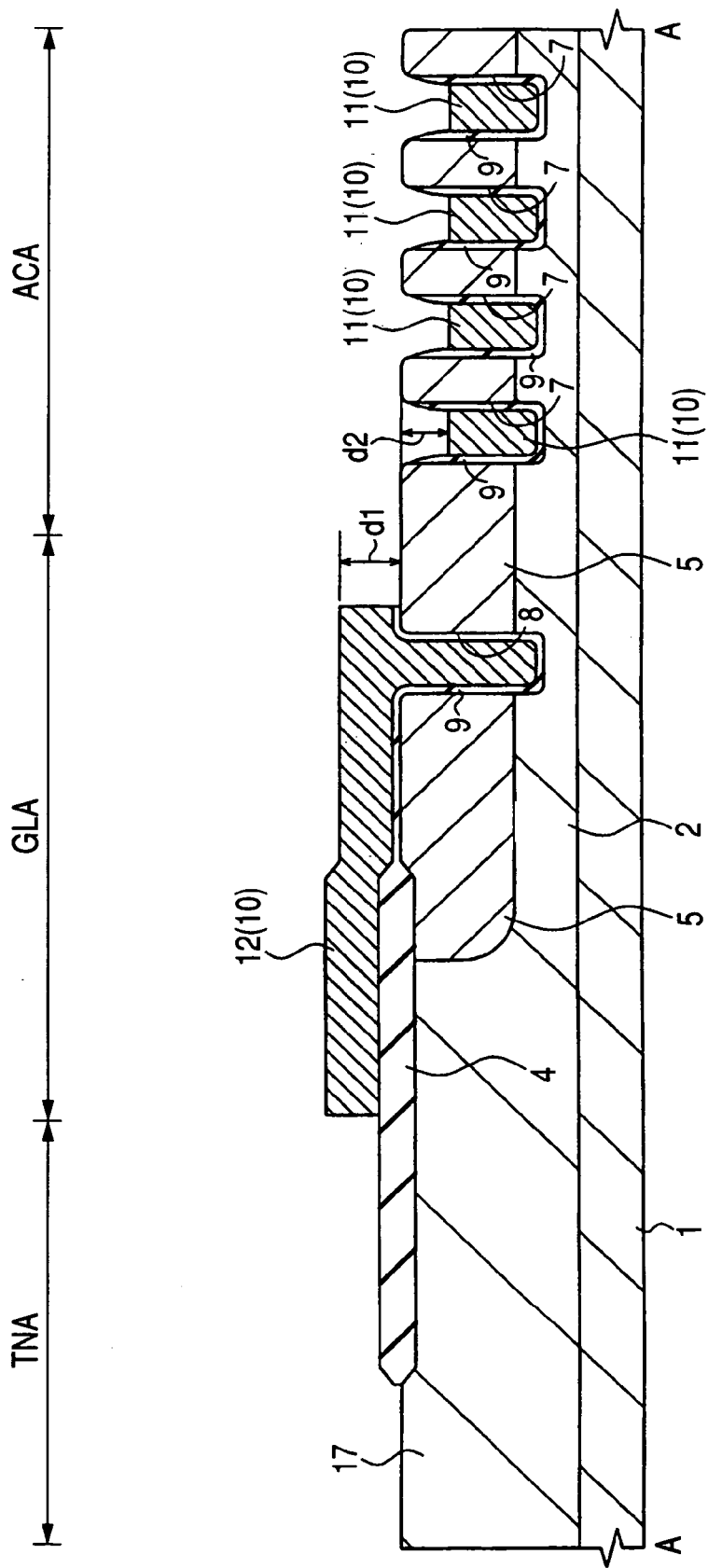
FIG. 4 is a sectional view taken along line A-A in FIG. 3.
Figure 5:
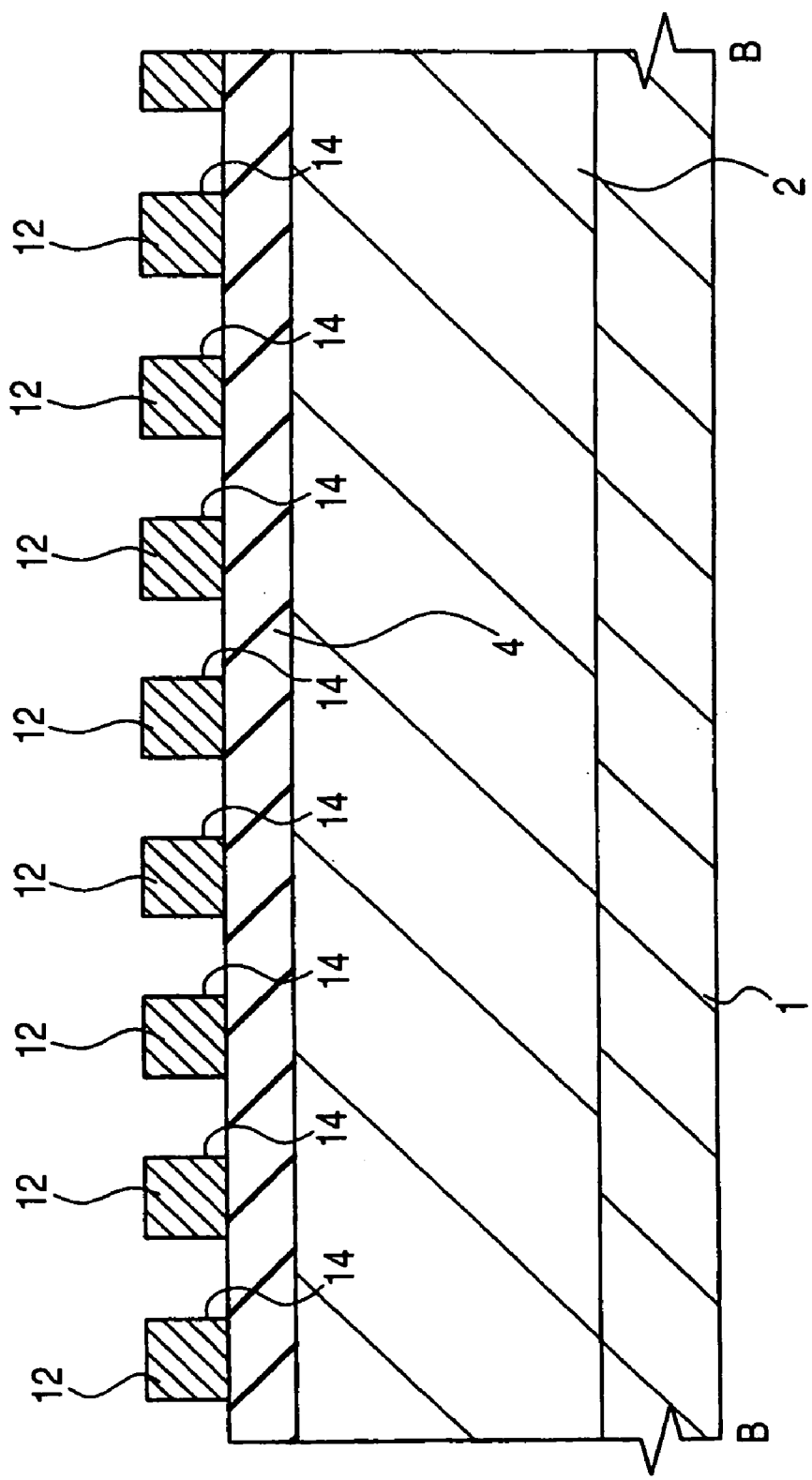
FIG. 5 is a sectional view taken along line B-B in FIG. 3.

FIG. 3 is a plan view of the substrate at the time of the following step, and FIGS. 4 and 5 are sectional views taken along the line A-A line and the line B-B in FIG. 3, respectively. FIG. 4 shows the same section as the section to which FIG. 2 has been referred for explanation of the previous step. In each sectional view representing subsequent steps, the diagram which has the mark A-A illustrates the same section as FIG. 4, and the diagram which has the mark B-B illustrates the same section as FIG. 5.

After forming the above-mentioned polycrystalline silicon film 10, as shown in FIGS. 3 to 5, gate wiring area GLA is covered with a photoresist film (illustration is omitted) patterned by photo lithography technology, and the polycrystalline silicon film 10 is etched using the photoresist film as a mask. Thereby, in active cell area ACA, polycrystalline silicon film 10 remains only in the groove portions 7, and a gate electrode 11 can be formed from the polycrystalline silicon film 10 within each groove portion 7. In the gate wiring area GLA, the polycrystalline silicon film 10 is embedded inside of the groove portion 8, and it is patterned so that a part thereof may remain outside of groove portion 8, so that a gate drawing electrode 12 electrically connected to gate electrode 11 is formed. A slit (the third groove portion) 14, extending from the end portion of the gate drawing electrode 12, is formed in the gate drawing electrode 12. The defect that the gate drawing electrode 12 will be divided by slit 14 can be prevented by making the direction which this slit 14 extends correspond to the direction which intersects the direction (direction which gate drawing electrode 12 extends) in which groove portions 7 and 8 extend. Polycrystalline silicon film 10 is removed in the termination area TNA.

In this example, d1 is the film thickness of polycrystalline silicon film 10 (gate drawing electrode 12) outside of the groove portion 8, and d2 is the amount to which the over-etching of the polycrystalline silicon film 10 in groove portions 7 was performed, i.e., the depth from the opening of groove portions 7 to the surface of polycrystalline silicon film 10 (gate electrode 11) in groove portions 7. In this Embodiment 1, the width and the interval of the slits 14 are set up so that the volume of the slits 14 and the volume of the groove portions 7 above the gate electrodes 11 will be the same.

Figure 6:
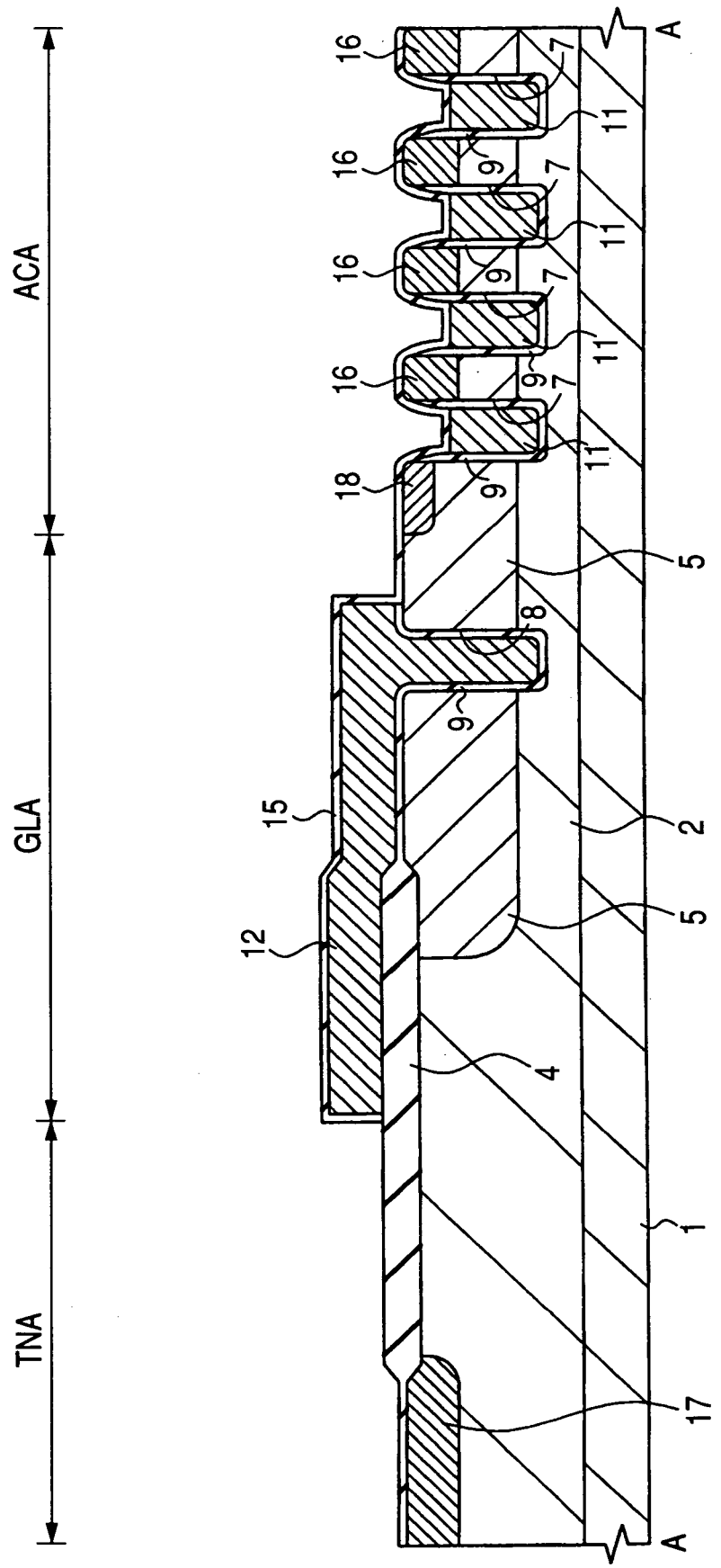
FIG. 6 is a sectional view showing a step in the process of manufacture of the semiconductor device following the step shown in FIG. 4.
Figure 7:
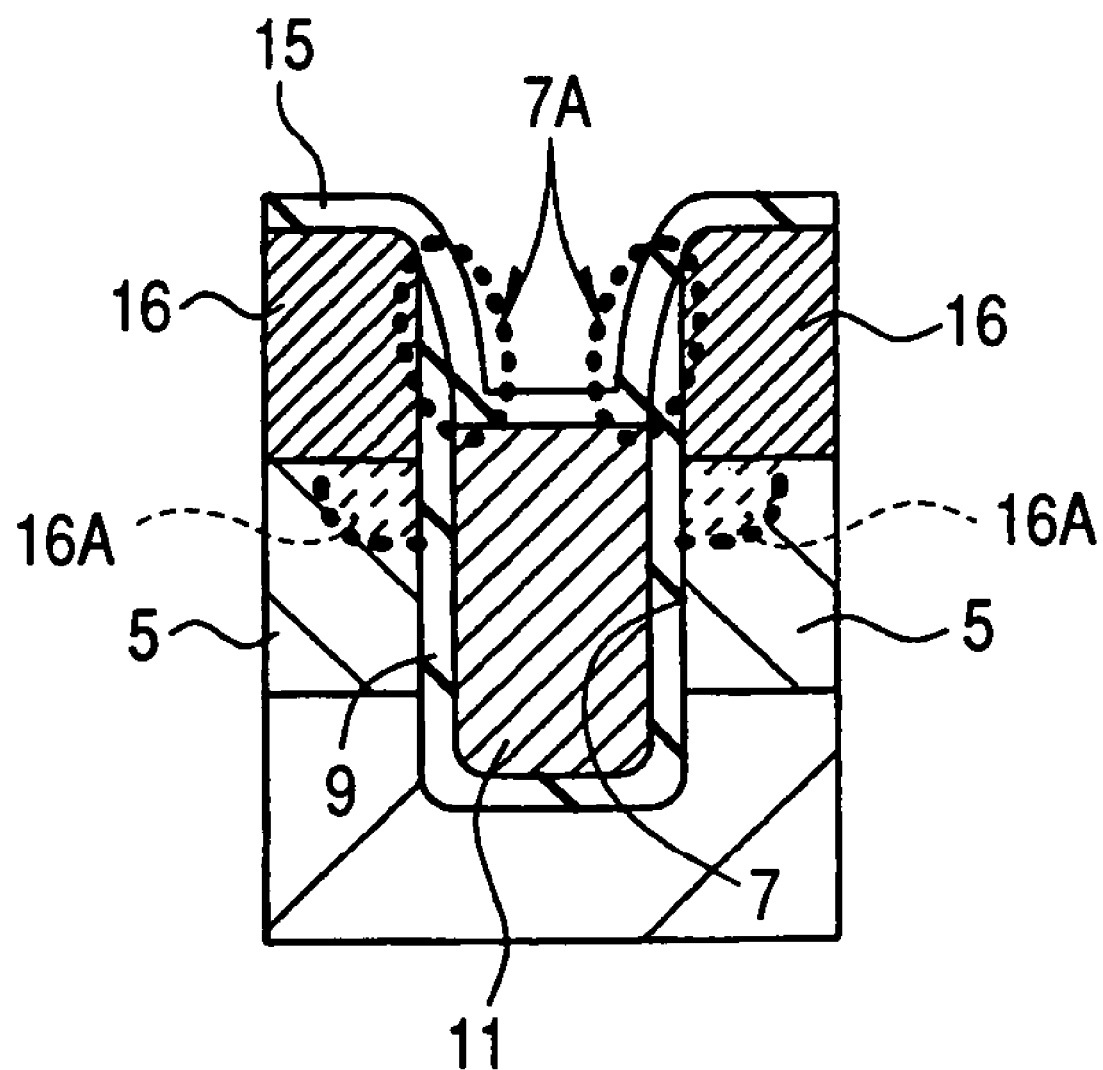
FIG. 7 is a sectional view of the semiconductor device representing Embodiment 1 of the present invention.

Next, as shown in FIG. 6, a silicon oxide film 15 of about 20 nm in film thickness is formed by applying heat-treatment to the substrate. At this time, as shown in FIG. 7, which is an expanded view of the groove portion 7, in a side wall 7A, from the opening of the groove portion 7 to the surface of the gate electrode 11, gate oxide film 9 and silicon oxide film 15 are formed as films in a state where they are overlapped on each other.

Then, by introducing p type impurities (for example, BF2 (2 boron fluoride)) into the n-type semiconductor area 5 by using as a mask a photoresist film (illustration being omitted) patterned by photo lithography technology, a $p^+$ type semiconductor area (the third semiconductor layer) 16 is formed in the n-type semiconductor area 5 of the active cell area ACA, and a $p^+$ type girdling area 17 is formed in termination area TNA. The $p^+$ type semiconductor area 16 serves as a source of the trench gate type power MISFET of the Embodiment 1. The $p^+$ type girdling area 17 is formed so that the active cell area ACA and the gate wiring area GLA may be surrounded in a plane. At the time of the step which introduces these p type impurities, as mentioned above, the double silicon oxide film formed of gate oxide film 9 and silicon oxide film 15 is formed on the side wall extending from the opening of groove portions 7 to the surface of gate electrode 11. This prevents the introduction of p type impurities into the n-type semiconductor area 5 from the side wall of groove portions 7, and it becomes possible to optimize the concentration profile of $p^+$ type semiconductor area 16. That is, it becomes possible to prevent the defect that a $p^+$ type semiconductor area 16A (refer to FIG. 7) which is not desirable will be formed in the lower part of the $p^+$ type semiconductor area 16 of the desired formation range. Introducing p type impurities into gate electrode 11 from the side wall of groove portion 7 can also be prevented, and a desired gate breakdown voltage can be secured.

Then, by introducing n type impurities (for example, P (phosphorus)) into the n-type semiconductor area 5 by using as a mask a photoresist film (illustration being omitted) patterned by photo lithography technology, an $n^+$ type semiconductor area 18 is formed in the n-type semiconductor area 5 of active cell area ACA.

Figure 8:
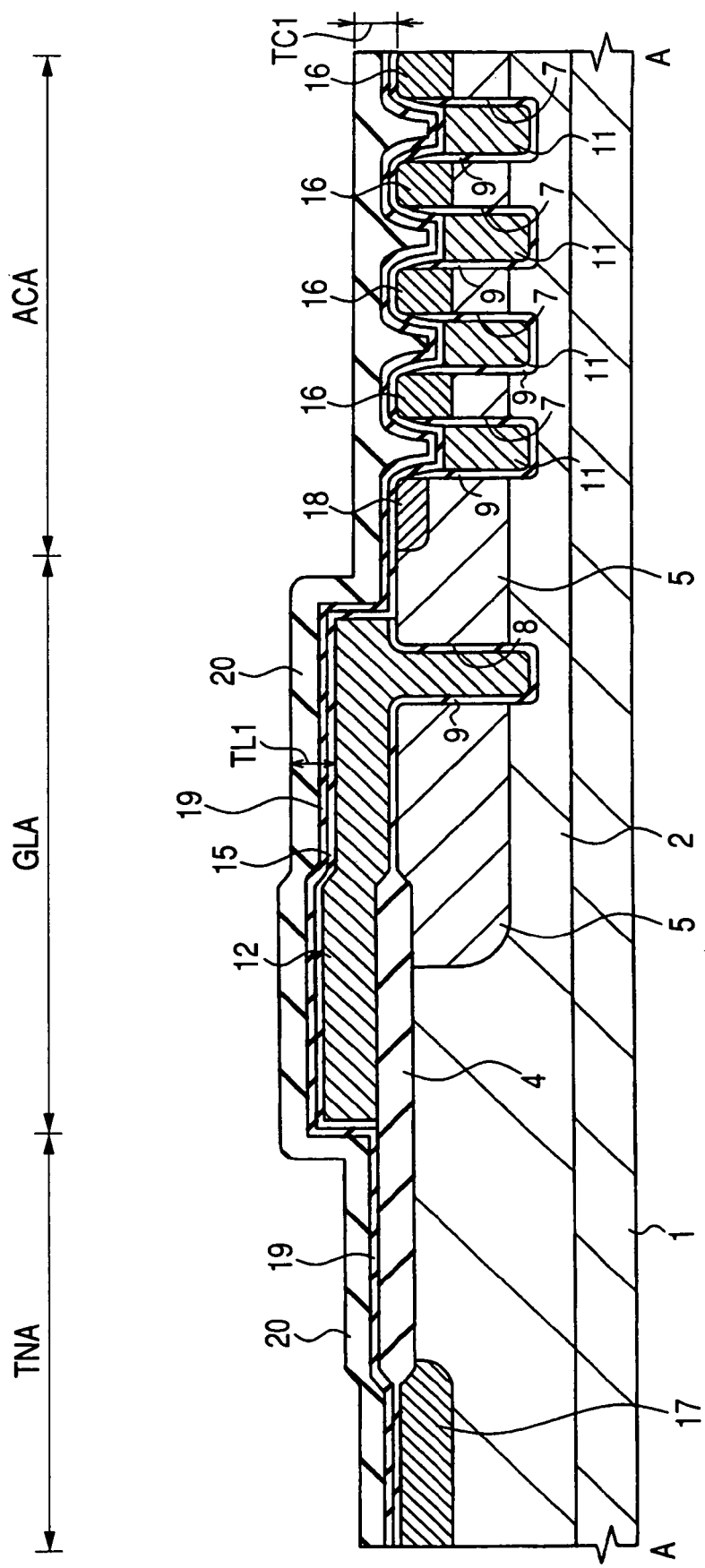
FIG. 8 is a sectional view showing a step in the process of manufacture of the semiconductor device following the step shown in FIG. 6.
Figure 9:
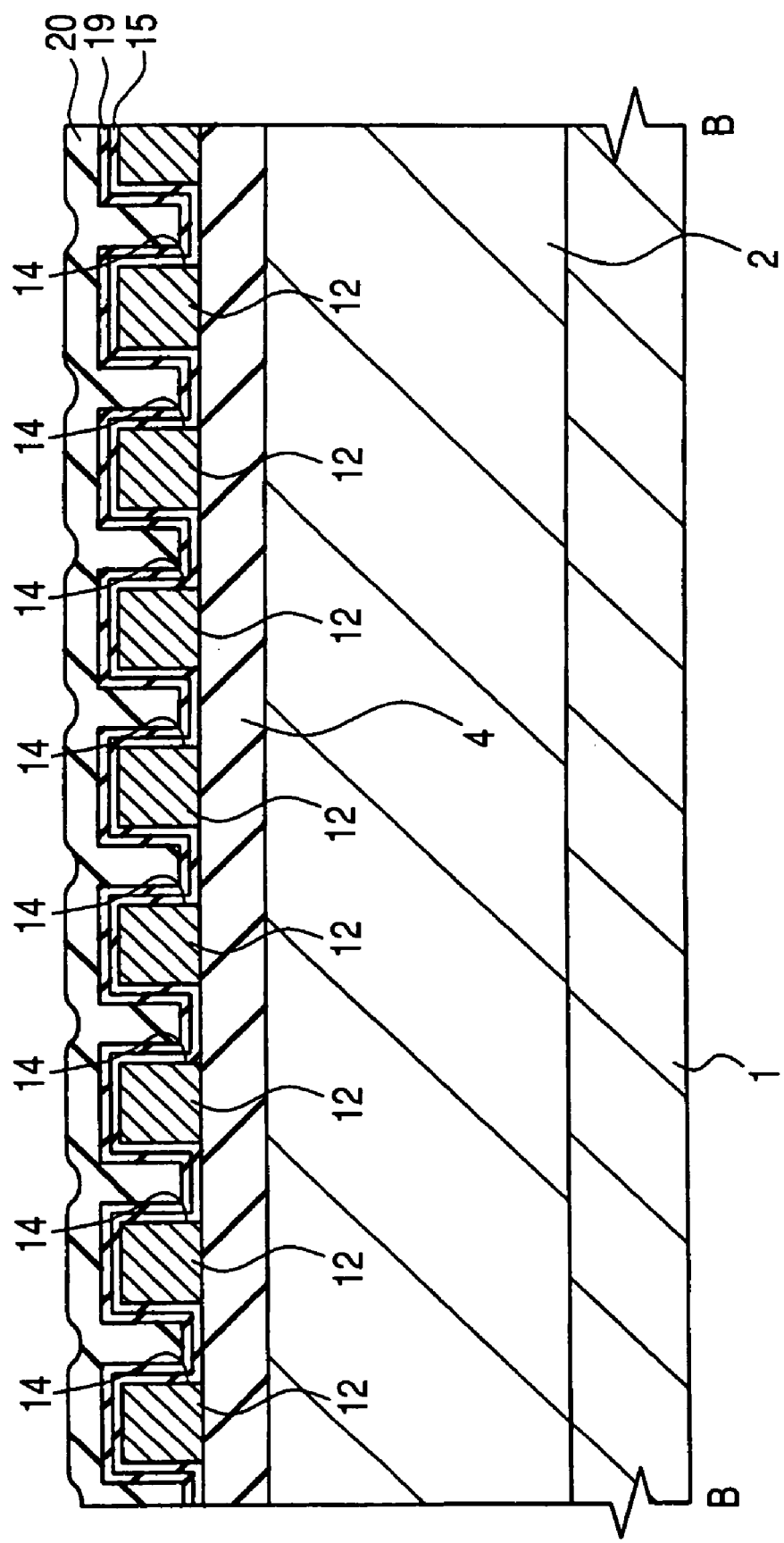
FIG. 9 is a sectional view, taken along line B-B of FIG. 3, of the semiconductor device in the step shown in FIG. 8.

Next, as shown in FIGS. 8 and 9, a silicon oxide film 19 of 900 Å at about 1100 Å in film thickness is deposited on a substrate using a CVD method. Then, a BPSG (Boro-Phospho Silicate Glass) film (the second insulation film) 20 of 4000 Å at about 5000 Å in film thickness is deposited on silicon oxide film (the second insulation film) 19 using a CVD method. Then, by applying heat treatment of about 900° C. to the substrate, the BPSG film 20 is made to mobilize and the level difference of the surface of the BPSG film 20 is eased.

Since the BPSG film 20 flows into groove portion 7 on the gate electrode 11, in a case where slits 14 (also see FIGS. 3 and 5) are not formed in the gate drawing electrode 12 which extends out of groove portion 8, the total film thickness TC1 in the active cell area ACA (except for the inside of groove portion 7) of the silicon oxide film 15, the silicon oxide film 19, and the BPSG film 20, becomes, by the part which flowed in, thinner than the total film thickness TL1 in the other areas, for example, in the gate wiring area GLA of the silicon oxide film 15, the silicon oxide film 19, and the BPSG film 20. On the other hand, in the Embodiment 1, since slits 14 are formed, the BPSG film 20 flows into these slits 14. As a result, the total film thickness TL1, for example, in the gate wiring area GLA, of the silicon oxide film 15, the silicon oxide film 19, and the BPSG film 20, can be less than or equal to the total film thickness TC1 in the active cell area ACA (except for the inside of groove portion 7) of the silicon oxide film 15, the silicon oxide film 19, and the BPSG film 20. The relation of the total film thickness of the silicon oxide film 15, the silicon oxide film 19, and the BPSG film 20 and the step performed in each of these areas will be explained in more detail, during explanation of the following step.

Figure 10:
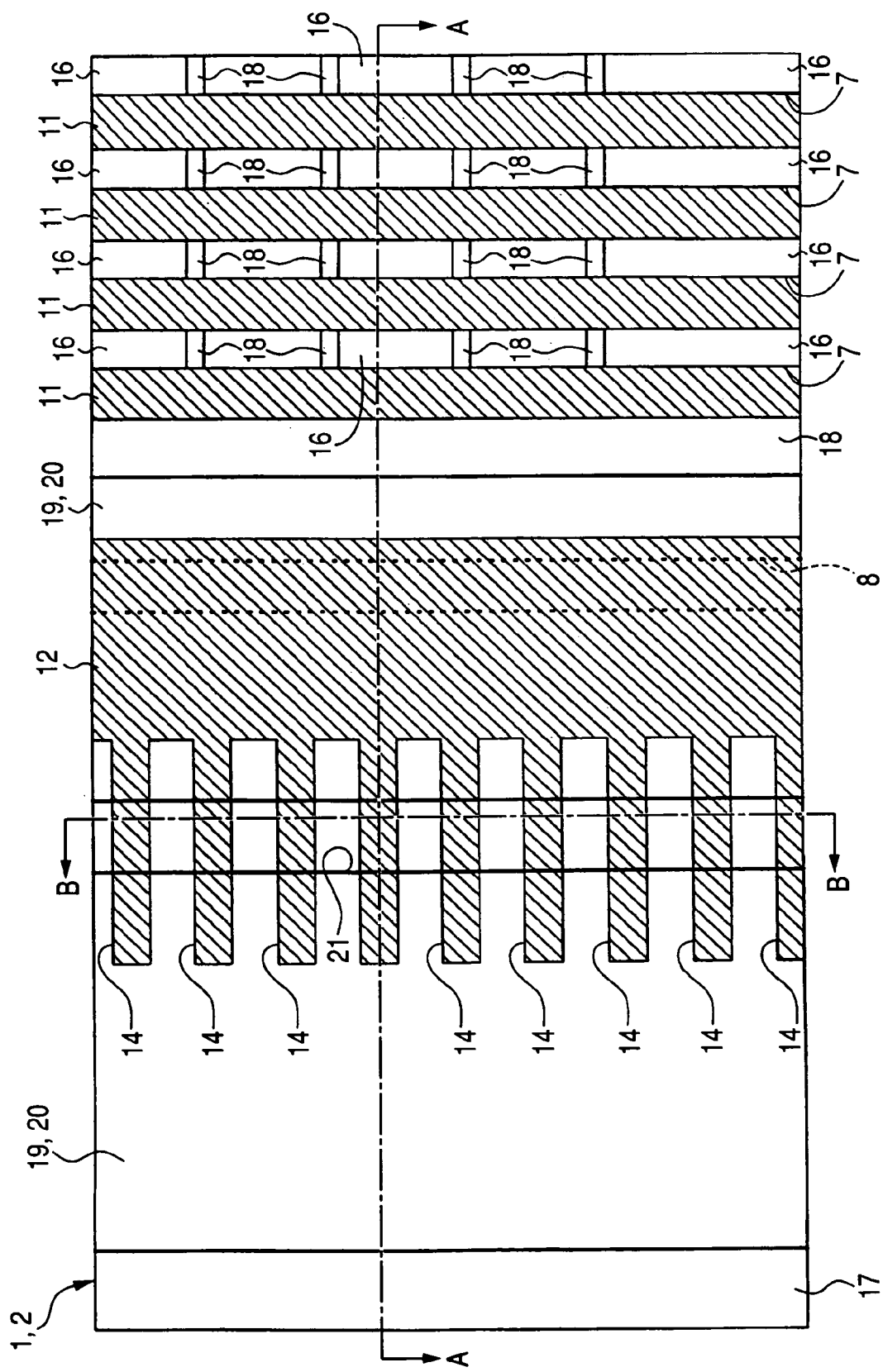
FIG. 10 is a plan view showing a step in the process of manufacture of the semiconductor device following the step shown in FIG. 8.
Figure 11:
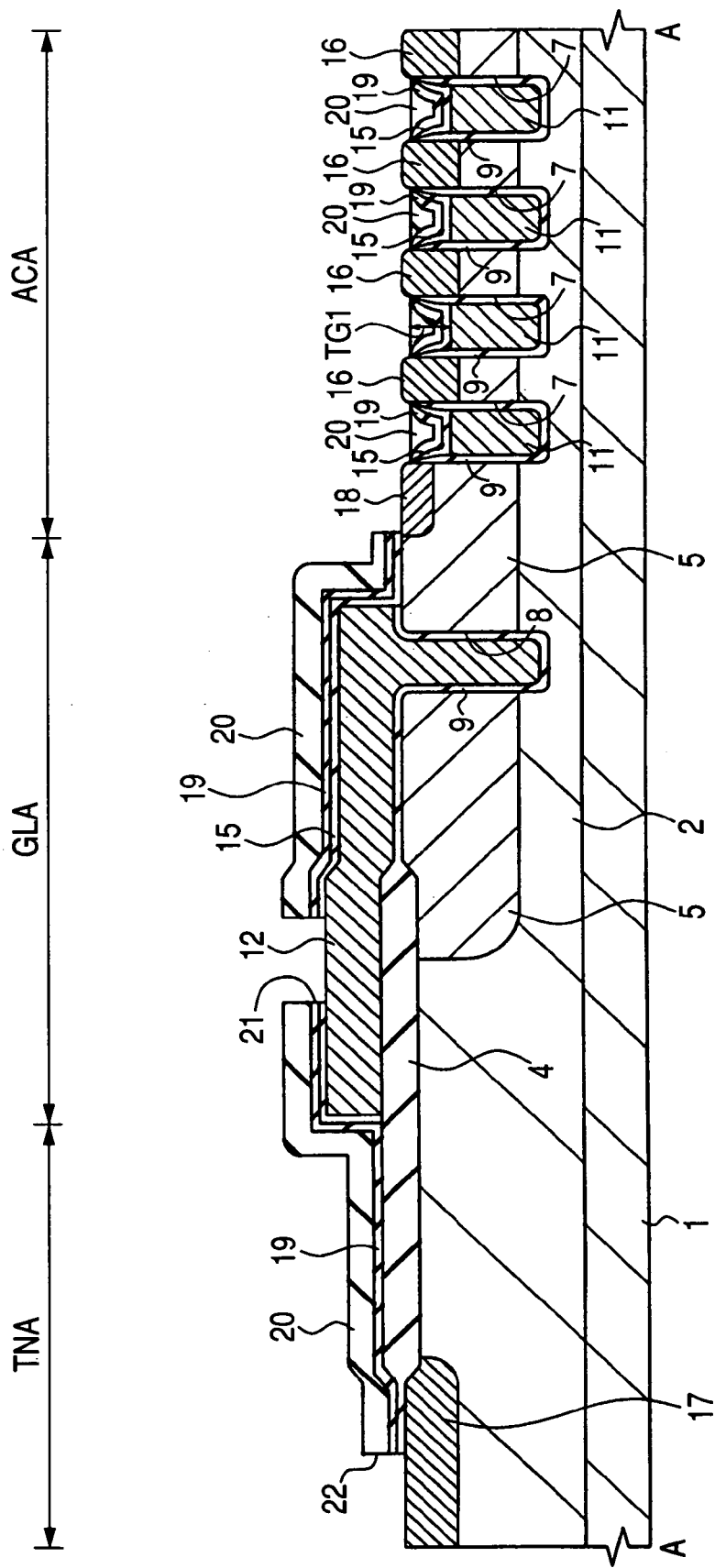
FIG. 11 is a sectional view taken along line A-A in FIG. 10.
Figure 12:
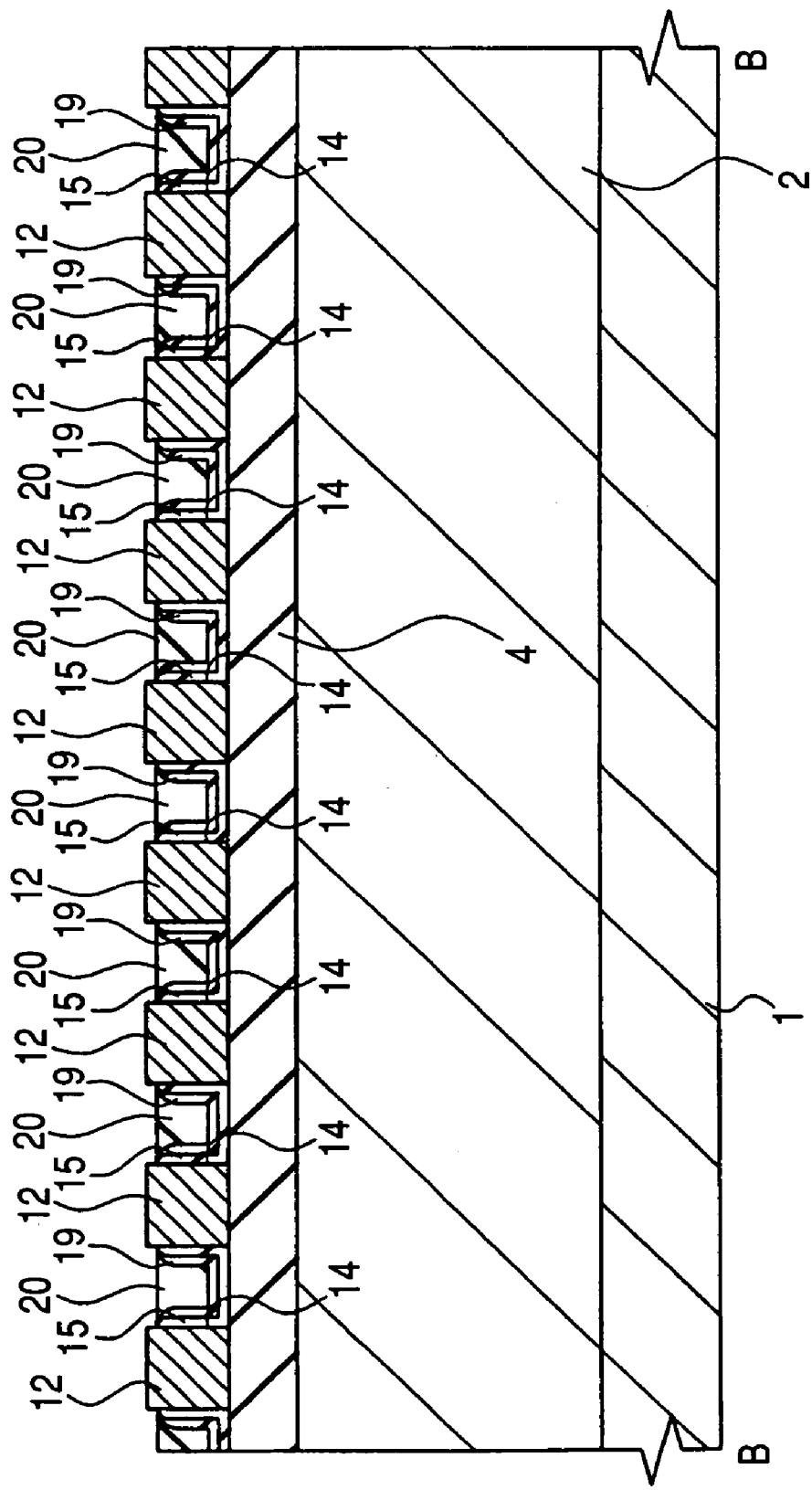
FIG. 12 is a sectional view taken along line B-B in FIG. 10.

Next, as shown in FIGS. 10 to 12, the BPSG film 20, the silicon oxide film 19, and the silicon oxide film 15 are patterned by etching using as a mask a photoresist film (illustration is omitted) patterned by photo lithography technology. Thereby, in active cell area ACA, the BPSG film 20, the silicon oxide film 19, and the silicon oxide film 15 are etched back, so that the BPSG film 20, the silicon oxide film 19, and the silicon oxide film 15 present outside of groove portions 7 are removed, and a determined amount of them is left behind in the groove portions 7. In the gate wiring area GLA, an opening (the first opening) 21, which reaches the gate drawing electrode 12, is formed in the BPSG film 20, silicon oxide film 19, and silicon oxide film 15. In termination area TNA, an opening 22 which extends to the $p^+$ type girdling area is formed.

As mentioned above, in a case where the slits 14 are not formed, the total film thickness TC1, in the active cell area ACA (except for the inside of groove portion 7), of the silicon oxide film 15, the silicon oxide film 19, and the BPSG film 20 becomes thinner than the total film thickness TL1 thereof in the gate wiring area GLA. Therefore, when the BPSG film 20, the silicon oxide film 19, and the silicon oxide film 15 are etched until the opening 21 reaches the gate drawing electrode 12 completely, the total film thickness of the BPSG film 20, the silicon oxide film 19, and the silicon oxide film 15 on gate electrode 11 may become inadequate for maintaining a desired gate breakdown voltage. On the other hand, as mentioned above with reference to FIG. 8, in the Embodiment 1, the total film thickness TL1, in the gate wiring area GLA, of the silicon oxide film 15, the silicon oxide film 19, and the BPSG film 20, can be less than or equal to the total film thickness TC1 thereof in the active cell area ACA (except for the inside of groove portion 7). By providing the total film thicknesses TC1 and TL1 of the silicon oxide film 15, the silicon oxide film 19, and the BPSG film 20, at the time of patterning these films, even when the opening 21 reaches the gate drawing electrode 12 completely, the silicon oxide film 15, the silicon oxide film 19, and the BPSG film 20 inside the groove portions 7 are not etched back, but are left so that the inside of groove portions 7 may be embedded completely. After the opening 21 reaches gate drawing electrode 12 completely, an etching back is advanced until the total film thickness TG1 of the silicon oxide film 15, in the groove portions 7, the silicon oxide film 19, and the BPSG film 20 becomes a desired thickness. This becomes possible in a trench gate type power MISFET of the Embodiment 1 to secure a desired gate breakdown voltage. In a case where the depth d2 (refer to FIG. 4) from the opening of groove portion 7 to the surface of gate electrode 11 in groove portion 7 is equal to the film thickness d1 (refer to FIG. 4) of the gate drawing electrode 12 outside of the groove portion 8, due to the width of slits 14 and the interval by which slit 14 is formed, for example, by setting the groove portion 7 and the width of slit 14 to be approximately the same size, and the interval between adjoining groove portions 7 and the total interval between adjoining slits 14 to be approximately the same size, the total film thickness TL1, in gate wiring area GLA, of silicon oxide film 15, silicon oxide film 19 and BPSG film 20 can be made equivalent to the total film thickness TC1 in the active cell area ACA (except for the inside of groove portion 7) of silicon oxide film 15, silicon oxide film 19, and BPSG film 20. If the film thickness d1 (refer to FIG. 4) of the gate drawing electrode 12 outside of groove portion 8 is set up to become thicker than the depth d2 (refer to FIG. 4) from the opening of groove portions 7 to the surface of gate electrode 11 in groove portions 7, the total film thickness TL1, in gate wiring area GLA, of silicon oxide film 15, silicon oxide film 19 and BPSG film 20 can be less than or equal to the total film thickness, in the active cell area ACA (except for the inside of groove portion 7), of silicon oxide film 15, silicon oxide film 19, and BPSG film 20.

The inventors attempted to find technology in which, even if slit 14 is not formed, and the upper surface of gate electrode 11 is made low in the depth direction of groove portions 7, even when the opening 21 reaches the gate drawing electrode 12 completely, the total film thickness TG1 in groove portions 7 of the silicon oxide film 15, the silicon oxide film 19, and the BPSG film 20 is provided as a sufficient film thickness to secure a desired gate breakdown voltage. However, if the upper surface of gate electrode 11 is made low in the depth direction of groove portions 7, it will be necessary to deeper the p$^+$ type semiconductor area 16 which is used as a source. Since the punch through voltage will fall if the source is made deep, it will be necessary to also deeper the n-type semiconductor area 5 which is used as a channel. If the n-type semiconductor area 5 used as a channel is made deep, it is necessary to also deeper the grooves 7 which pierce through it. Since the parasitic capacitance between the gate and the source increases when the grooves 7 become deep, a defect occurs in that the switching loss will increase. Since the depth variation will increase compared with the case of it being shallow if the grooves 7 are made deep, the portion among the groove portions 7, which runs through the n-type semiconductor area 5 used as the channel of the trench gate type power MISFET, and reaches the p-type single-crystal-silicon layer 2 used as a drain, increases. For this reason, a defect arises in that the parasitic capacitance between the gate and the drain produced between gate electrode 11 and p-type single-crystal-silicon layer 2 will increase, and the switching loss of the trench gate type power MISFET will increase. In order to deeply form the p$^+$ type semiconductor area 16 used as the source of the trench gate type power MISFET, and the n-type semiconductor area 5, a defect arises in that the time which the heat treatment for diffusing the impurities which form the p$^+$ type semiconductor area 16 and the n-type semiconductor area 5 takes will increase, and the TAT (Turn Around Time) in the manufacture of a semiconductor device will increase. Since the groove portions 7 must be formed deeply, a defect arises in that controlling the form of groove portions 7 becomes difficult, the time which etching takes will increase, and the TAT (Turn Around Time) in the manufacture of a semiconductor device will increase. On the other hand, according to the Embodiment 1, since, even if groove portions 7 are not formed deeply, the total film thickness TG1, in groove portion 7, of silicon oxide film 15, silicon oxide film 19, and BPSG film 20 can be sufficient to secure the desired gate breakdown voltage, so that these defects are avoided. Even if the Embodiment 1 is applied, since gate wiring area GLA and portions other than gate electrode 11, can be removed simultaneously using photo lithography technology after forming the polycrystalline silicon film 10, the process step does not increase with respect to the formation of slits 14.

Figure 13:
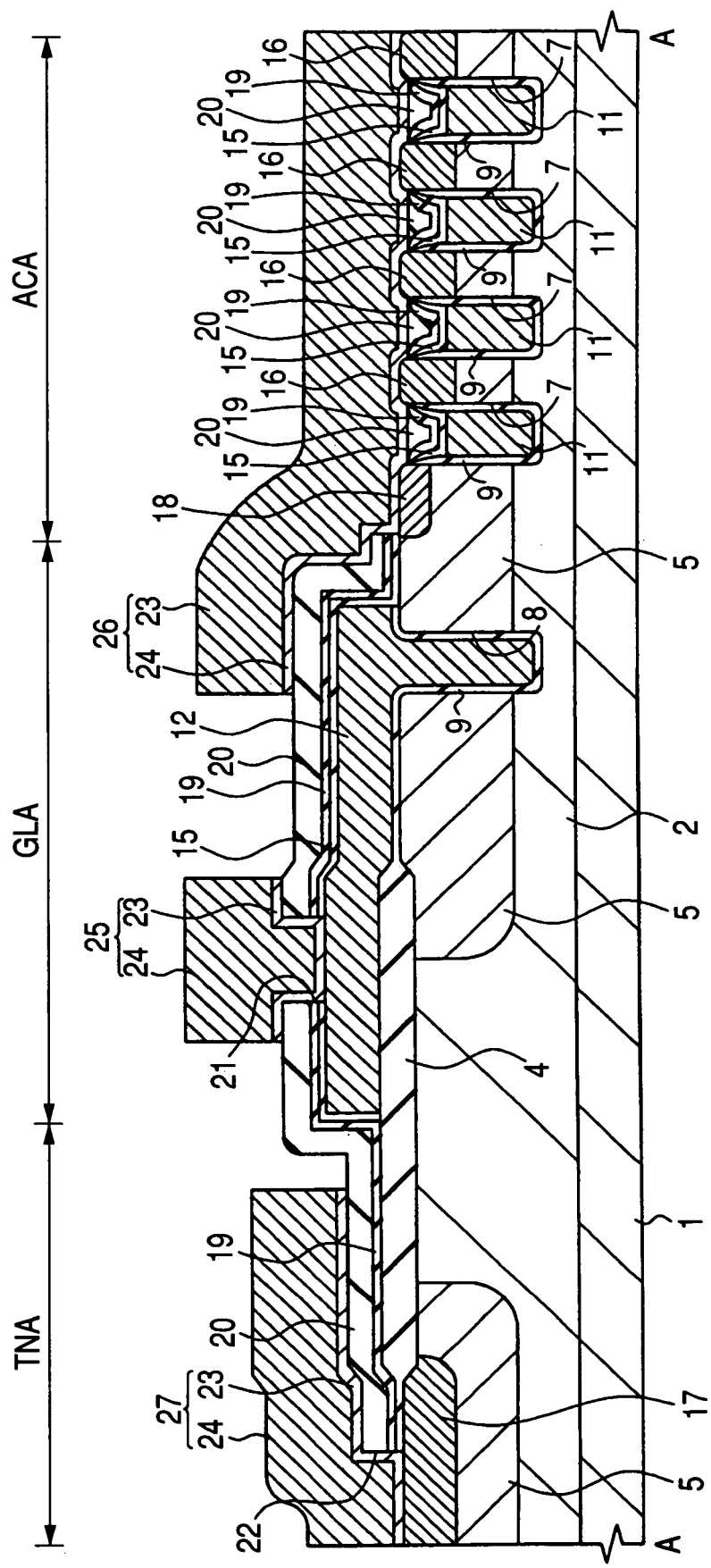
FIG. 13 is a sectional view showing a step in the process of manufacture of the semiconductor device following the step shown in FIG. 11.
Figure 14:
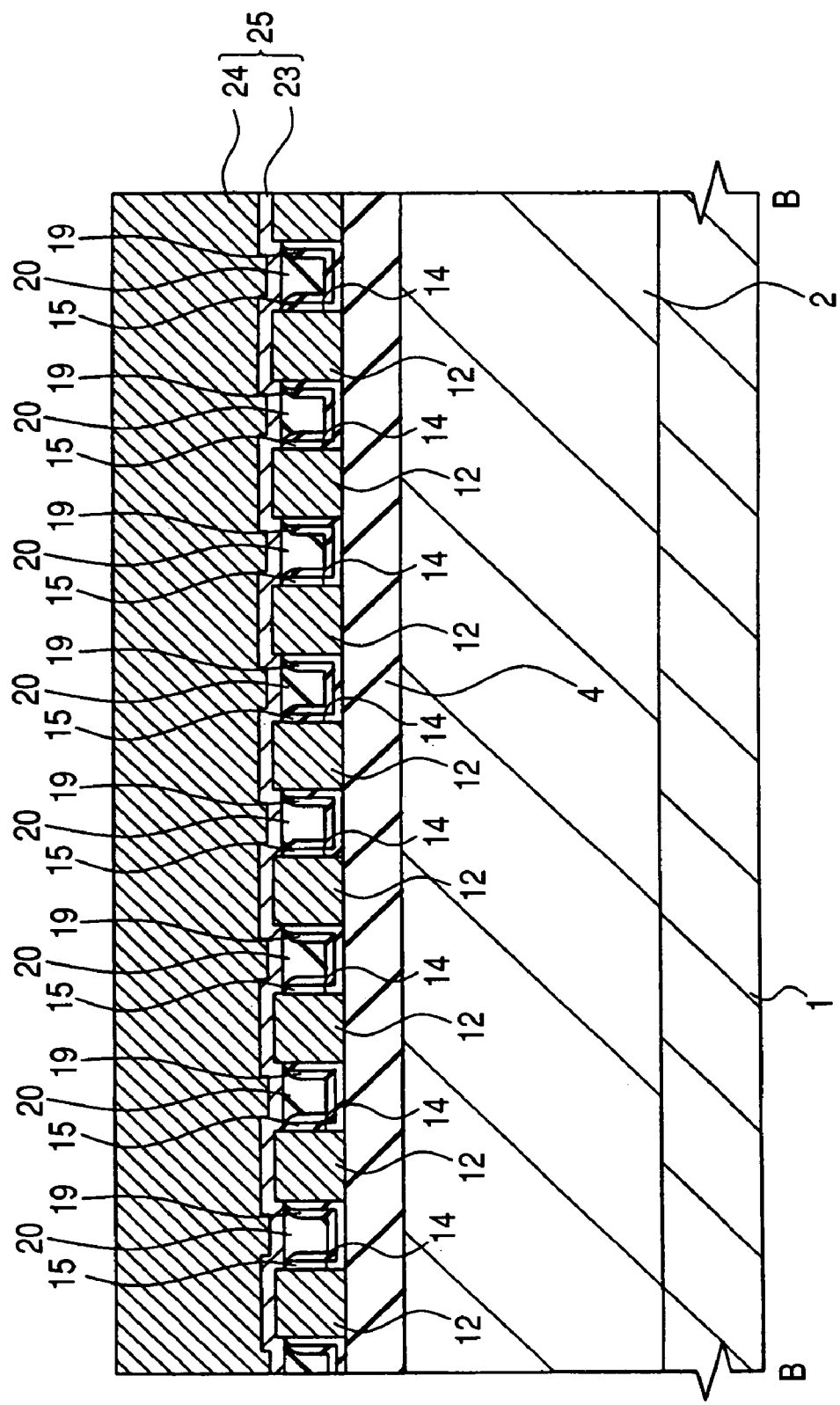
FIG. 14 is a sectional view, taken along line B-B of FIG. 10, of the semiconductor device in the step shown in FIG. 13.

Next, as shown in FIGS. 13 and 14, after depositing a TiW (titanium tungsten) film 23 of 1000 Å to a thickness of about 2200 Å, for example by the sputtering method to serve as a barrier conductor film on the substrate, the substrate is heat-treated. Then, an Al (aluminum) film 24 of 26000 Å having a thickness of about 55000 Å is deposited, for example, by sputtering, on the TiW film 23. The barrier conductor film serves to prevent an undesired reaction layer from being formed when the substrate (Si) contacts Al. In the Embodiment 1, the Al film may be a film in which Al is the main ingredient, and it may contain another metal etc. Then, by etching the TiW film 23 and Al film 24 using a photoresist film patterned by photo lithography technology as a mask, a gate wiring (the second wiring) 25 electrically connected to gate drawing electrode 12, a source pad (source electrode (the first wiring)) 26 electrically connected to p$^+$ type semiconductor area 16 used as the source area of the power MISFET, a wiring 27 electrically connected to p$^+$ type girdling area 17, and a gate pad (gate electrode) electrically connected to gate wiring 25 are formed. The gate pad is formed in an area which is not illustrated in FIGS. 13 and 14.

Although illustration is omitted, after forming the above-mentioned gate wiring 25, source pad 26, wiring 27, and a gate pad, a polyimide resin film is applied to the upper part of the substrate to serve as a protective film, for example, and by exposing and developing, the polyimide resin film on the gate pad and source pad 26 is removed, and openings are formed.

Subsequently, after protecting the surface of the substrate with a tape etc., the protected surface is oriented so as to be the bottom, and the back of the p$^+$ type single-crystal-silicon substrate 1 is ground. After removing the above-mentioned tape, on the back of the p$^+$ type single-crystal-silicon substrate 1, serving as a conductive film, a Ti (titanium) film, a Ni (nickel) film, and a Au (gold) film are deposited by sputtering one at a time, for example, and these lamination films are formed. These lamination films serve as a drawing electrode (drain electrode) of a drain (p$^+$ type single-crystal-silicon substrate 1 and p-type single-crystal-silicon layer 2).

Then, after forming the bump electrode which includes Au etc., for example, on the opening formed in the above-mentioned polyimide resin film, dicing of the substrate in a wafer state is performed, for example, along a division area (illustration is omitted), and it is divided to form individual chips. Then, each chip is mounted on a lead frame (mounting board) which has an external terminal, for example, sealing (mounting) is performed by use of resin etc., and manufacture of the semiconductor device of the Embodiment 1 is completed.

Embodiment 2

The semiconductor device of the Embodiment 2 is a p channel type power MISFET like the semiconductor device of the Embodiment 1, for example. The method of manufacture of the semiconductor device of this Embodiment 2 will be explained with reference to FIGS. 15 and 16.

Figure 15:
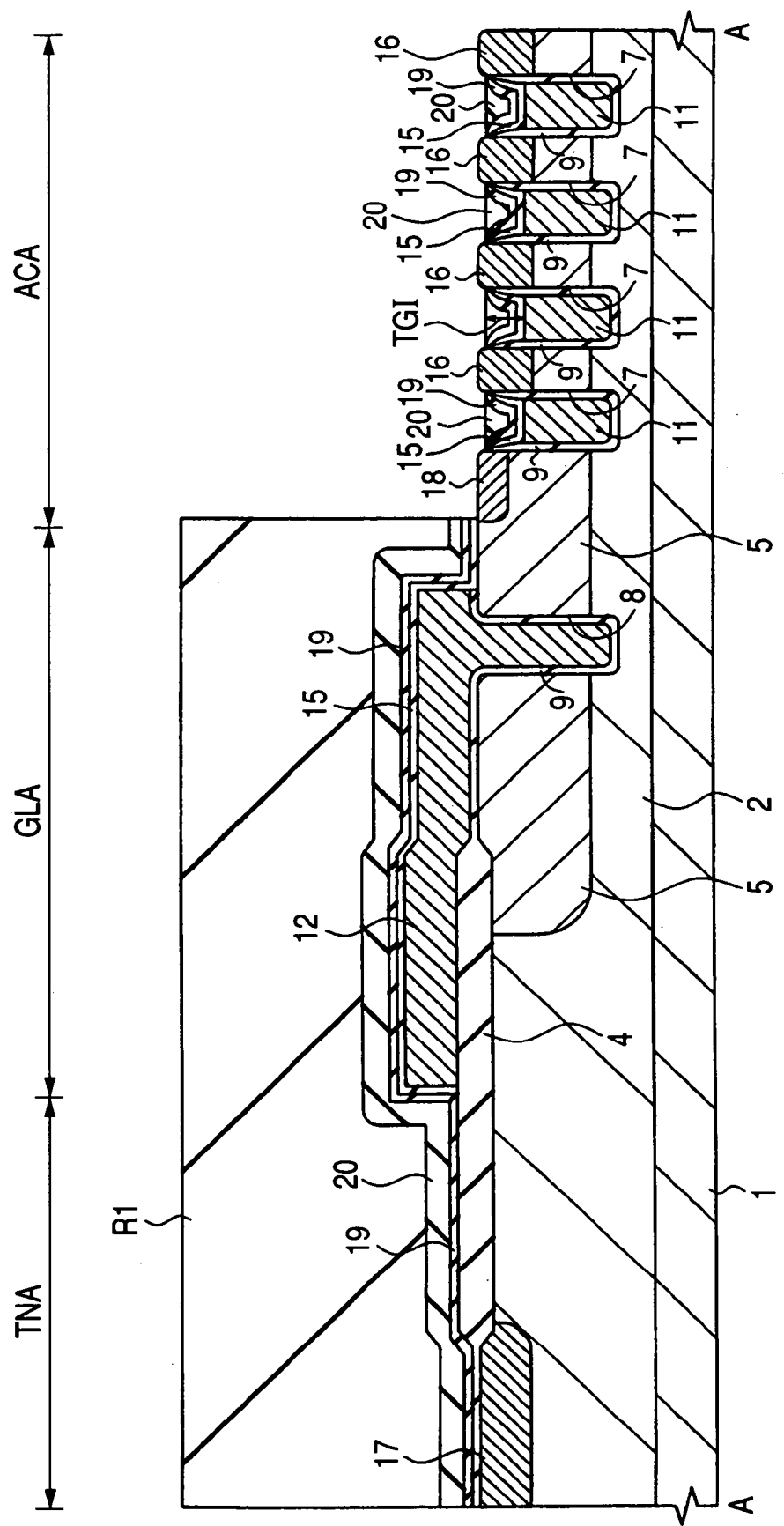
FIG. 15 is a sectional view showing a step in the process of manufacture of a semiconductor device representing an Embodiment 2 of the present invention.

The manufacturing process for fabrication of the semiconductor device of Embodiment 2 is the same up to the step (refer to FIGS. 8 and 9) in which the BPSG film 20 is formed as a film in the Embodiment 1, but slits 14 (refer to FIGS. 3 and 5) are not formed in gate drawing electrode 12. Then, as shown in FIG. 15, gate wiring area GLA and termination area TNA on the substrate are covered with photoresist film R1 patterned by photo lithography technology, and the BPSG film 20, the silicon oxide film 19, and the silicon oxide film 15 in the active cell area ACA are etched. Thereby, the in active cell area ACA, the BPSG film 20, the silicon oxide film 19, and the silicon oxide film 15 outside of groove portion 7 are removed, and the total film thickness TG1 of the silicon oxide film 15, the silicon oxide film 19, and the BPSG film 20 may be set to a desired film thickness in groove portions 7.

Figure 16:
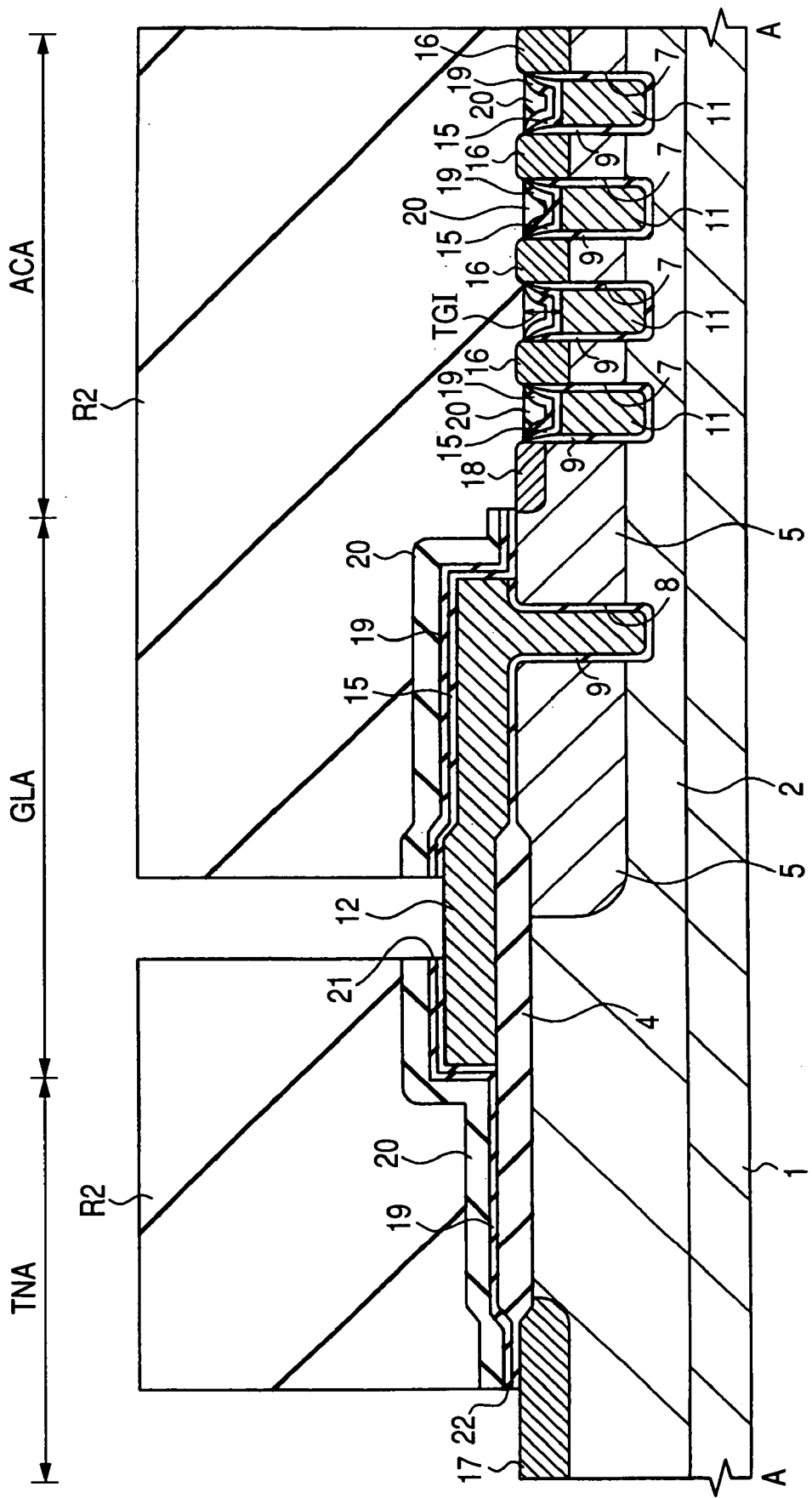
FIG. 16 is a sectional view showing a step in the process of manufacture of the semiconductor device following the step shown in FIG. 15.

Next, after removing the above-mentioned photoresist film R1, as shown in FIG. 16, with the photoresist film R2 newly patterned by photo lithography technology, areas other than the area in which openings 21 and 22 on the substrate are formed are covered, and the BPSG film 20, the silicon oxide film 19, and the silicon oxide film 15 are etched. Thereby, openings 21 and 22 can be formed, without reducing the BPSG film 20 and the silicon oxide film 19 in groove portion 7 in volume. That is, in the trench gate type power MISFET of the Embodiment 2, it also becomes possible to secure a desired gate breakdown voltage.

Then, the manufacture of the semiconductor device of the Embodiment 2 is completed by carrying out the same steps as explained above using FIGS. 13 and 14 for the Embodiment 1.

Also, by the above Embodiment 2, the same effect as the Embodiment 1 can be attained.

Embodiment 3

The semiconductor device of the Embodiment 3 is a p channel type power MISFET like the semiconductor device of the Embodiments 1 and 2, for example. The method of manufacture of the semiconductor device of this Embodiment 3 will be explained with reference to FIGS. 17 and 18.

Figure 17:
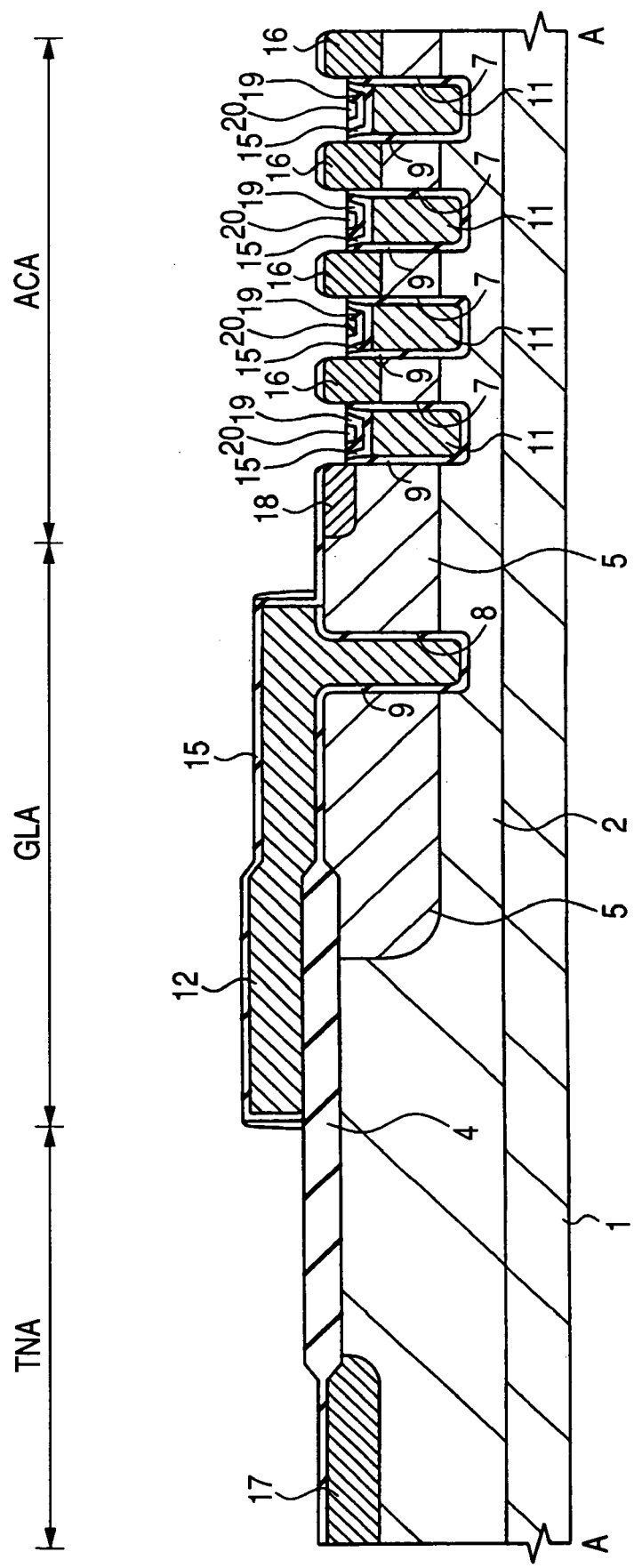
FIG. 17 is a sectional view showing a step in the process of manufacture of a semiconductor device representing an Embodiment 3 of the present invention.
Figure 18:
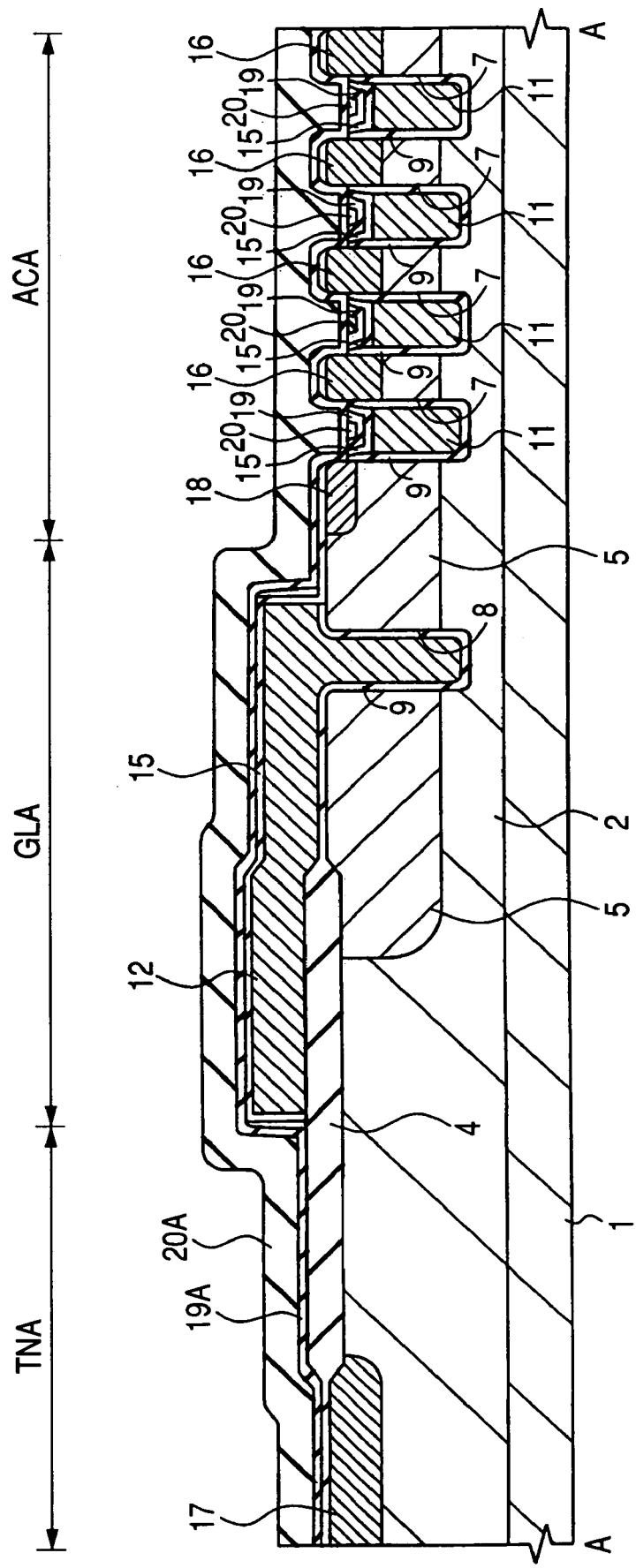
FIG. 18 is a sectional view showing a step in the process of manufacture of the semiconductor device following the step shown in FIG. 17.

The manufacturing process for fabrication of the semiconductor device of the Embodiment 3 is the same up to the step (refer to FIGS. 8 and 9) in which the BPSG film 20 is formed as a film in the Embodiment 1, but slits 14 (refer to FIGS. 3 and 5) are not formed in gate drawing electrode 12. Then, as shown in FIG. 17, the BPSG film 20 and the silicon oxide film 19 are etched back, and the BPSG film 20 and silicon oxide film 19 outside of the groove portion 7 are removed. Here, the total film thickness of the BPSG film 20, the silicon oxide film 19, and the silicon oxide film 15 which remain in groove portions 7 is checked. Then, as shown in FIG. 18, the same silicon oxide film (the second insulation film, the third insulation film) 19A as the silicon oxide film 19 and the same BPSG film (the second insulation film, the third insulation film) 20A as the BPSG film 20 are deposited one at a time on the substrate, and the substrate is heat-treated, so that the BPSG film 20A is made to mobilize.

When the BPSG film 20 and the silicon oxide film 19 are etched back at this time, in a case where the total film thickness of the BPSG film 20, the silicon oxide film 19, and the silicon oxide film 15 which remain in groove portions 7 is sufficient to secure a desired gate breakdown voltage, the BPSG film 20A, the silicon oxide film 19A, and the silicon oxide film 15 are etched, and openings 21 and 22 are formed; and then, the manufacture of the semiconductor device of the Embodiment 3 is completed by carrying out the same steps as the steps explained above with reference to FIGS. 13 and 14 for the Embodiment 1. When the BPSG film 20 and the silicon oxide film 19 are etched back, on the other hand, in a case where the total film thickness of the BPSG film 20, the silicon oxide film 19, and the silicon oxide film 15 which remain in groove portions 7 is not sufficient to secure a desired gate breakdown voltage, the BPSG film 20A and the silicon oxide film 19A are etched back, and the BPSG film 20A and the silicon oxide film 19A outside of the groove portions 7 are removed. Here, checking the total film thickness of the BPSG films 20 and 20A, silicon oxide films 19 and 19A, and silicon oxide film 15 which remain in groove portions 7, in a case where it is not sufficient to secure a desired gate breakdown voltage, after repeating the step in which silicon oxide film 19A and BPSG film 20A are deposited and the step in which this lamination film is etched back until it becomes the sufficient in total film thickness, openings 21 and 22 are formed. Also, in the trench gate type power MISFET of the Embodiment 3, it becomes possible to secure a desired gate breakdown voltage.

Embodiment 4

The semiconductor device of the Embodiment 4 is a p channel type power MISFET like the semiconductor device of the Embodiments 1 to 3, for example. The manufacturing method for fabrication of the semiconductor device of this Embodiment 4 will be explained with reference to FIGS. 19 and 20.

Figure 19:
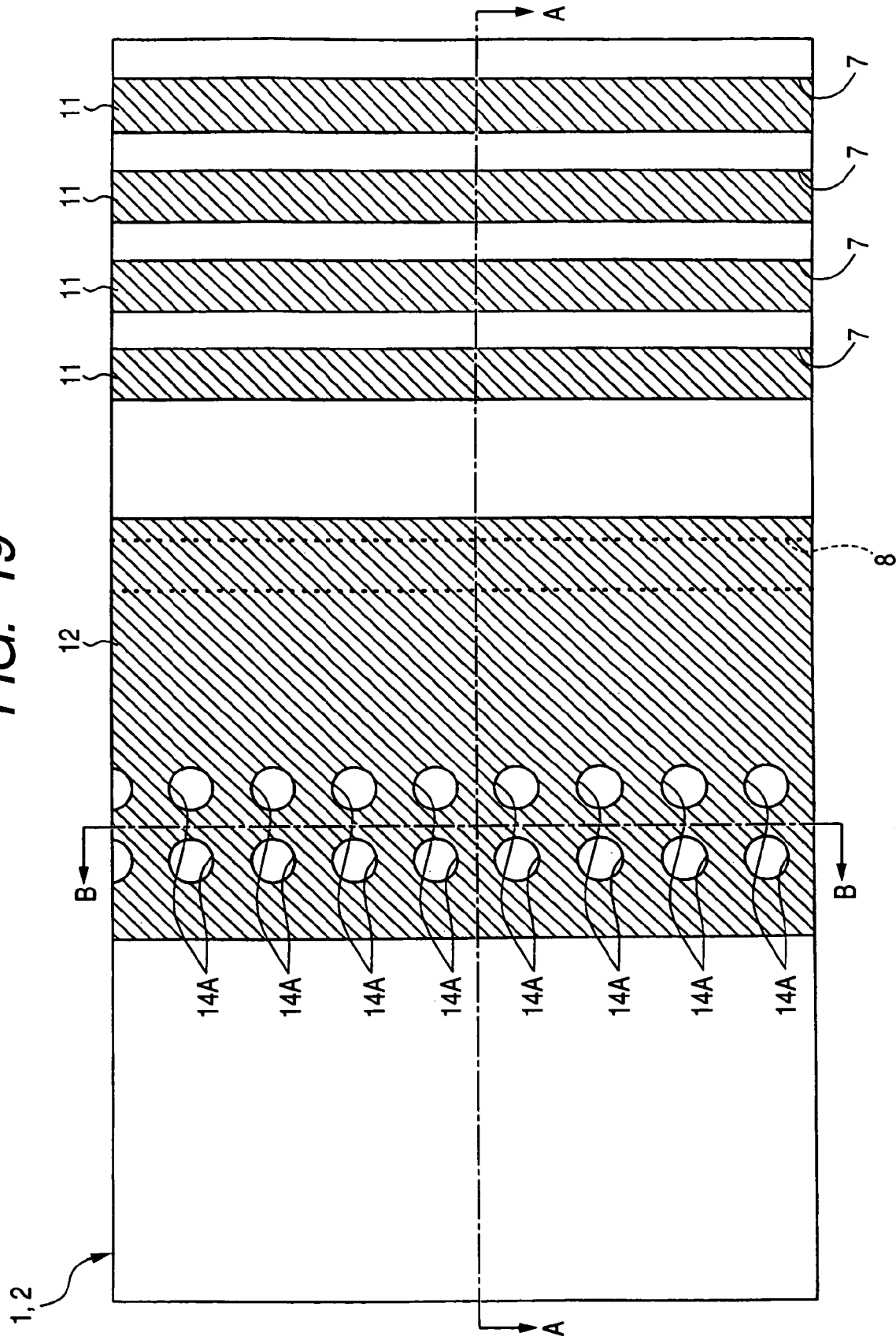
FIG. 19 is a plan view showing a step in the process of manufacture of a semiconductor device representing an Embodiment 4 of the present invention.

Although the manufacturing process of the semiconductor device of the Embodiment 4 is almost the same as the manufacturing process used for fabrication of the semiconductor device of the Embodiment 1, as shown in FIG. 19, a plurality of openings (the third groove portion) 14A having a circular plane form are formed in gate drawing electrode 12, instead of slits 14 (refer to FIGS. 3 and 5), which are formed in the Embodiment 1. The diameter of this opening 14A is comparable to the width of slit 14. By forming opening 14A as a circle in plane form, instead of slit 14, the area in which gate wiring 25 (refer to FIGS. 13 and 14) formed at a later step and the gate drawing electrode 12 contact can be increased. Thereby, the gate resistance can be reduced.

Figure 20:
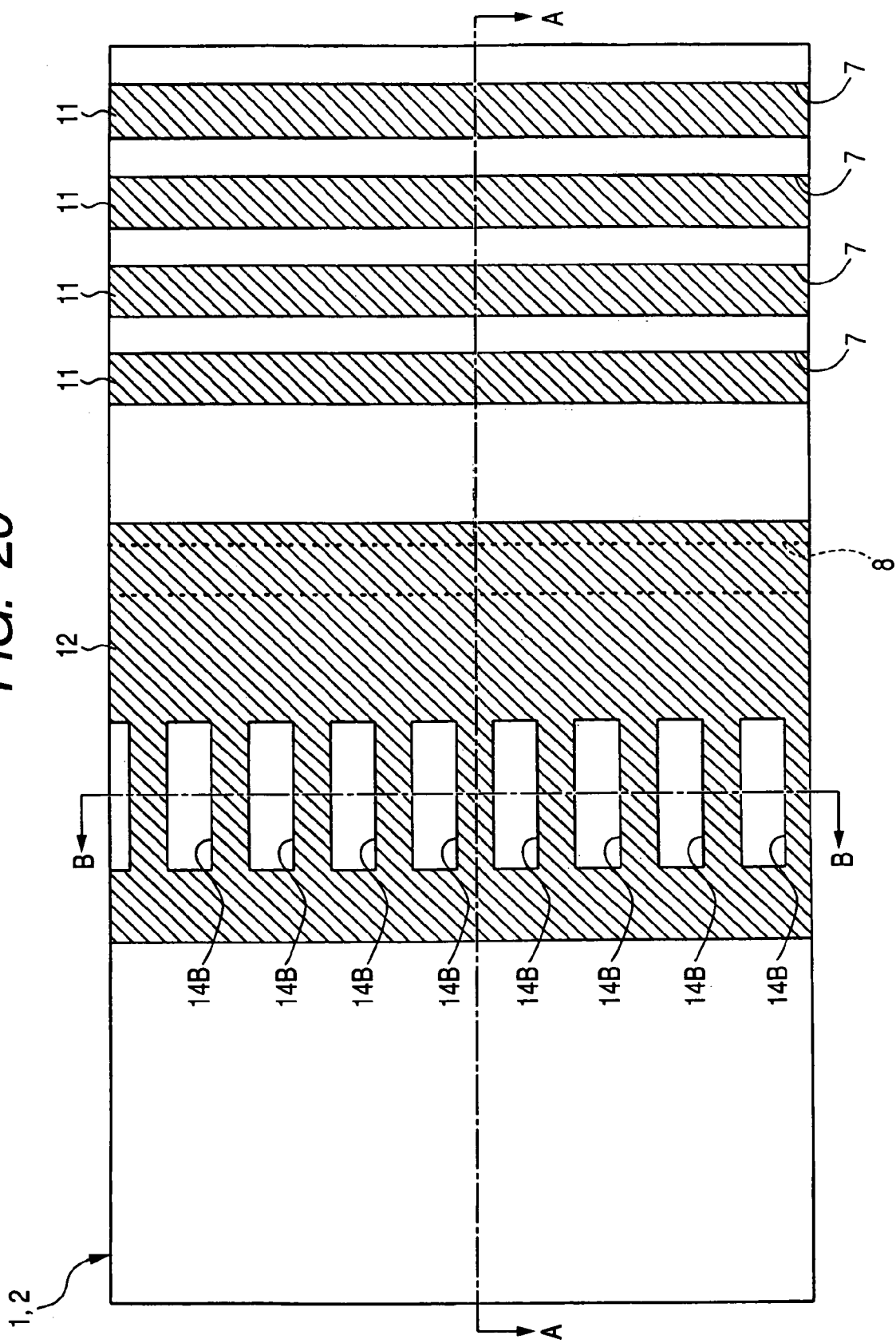
FIG. 20 is a plan view showing a step in the process of manufacture a modification of the semiconductor device representing Embodiment 4 of the invention.
Figure 21:
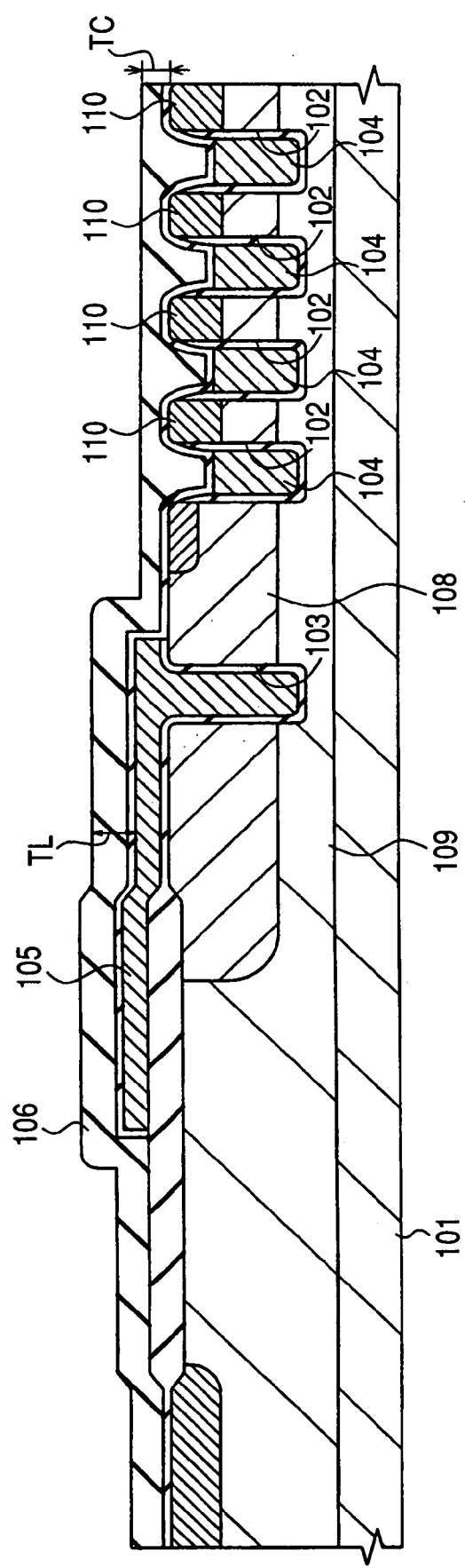
FIG. 21 is a sectional view showing a step in the process of manufacture of a semiconductor device which the inventors examined.
Figure 22:
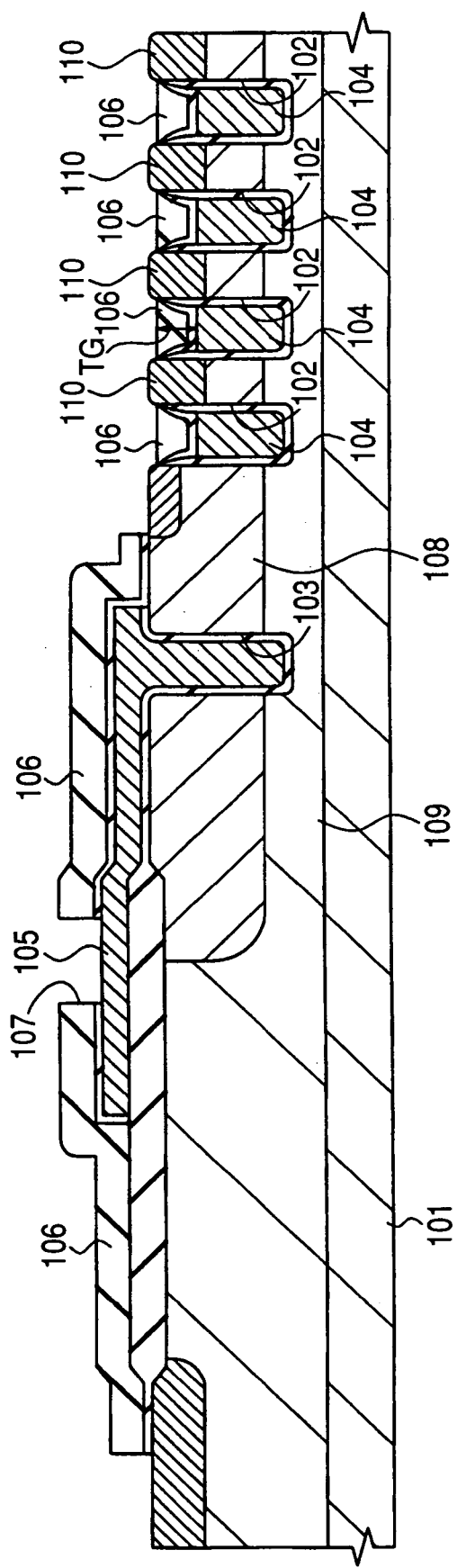
FIG. 22 is a sectional view showing a step in the process of manufacture of the semiconductor device following the step shown in FIG. 21.

As shown in FIG. 20, a slit (the third groove portion) 14B, which does not reach to the end portion of gate drawing electrode 12, may be formed instead of slits 14. Thus, by forming slit 14B surrounded by gate drawing electrode 12 in the circumference at the plane, since the gate drawing electrode 12 can be increased in cross-sectional area in the direction which goes direct with a current course, the gate resistance can be reduced. From the viewpoint that the cross-sectional area in the direction which goes direct with a current course can be increased, even in a case where the above-mentioned opening 14A with circular plane form is formed, the same effect can be acquired.

As mentioned above, although the invention made by the inventors has been concretely explained based on the embodiments thereof, it cannot be overemphasized that the invention is not limited to these embodiments, but can change variously in a range which does not deviate from the gist of the invention.

Although, for example, the process of manufacture of a semiconductor device containing a trench gate type power MISFET has been described, the same manufacturing process is applicable also to the manufacture of a semiconductor device containing an IGBT (Insulated Gate Bipolar Transistor), which similarly has a gate electrode in the groove portion formed in the substrate.

The method of manufacture of a semiconductor device in accordance with the present invention is applicable to the manufacture of a semiconductor device which has a power MISFET of a trench gate type, for example.

What is claimed is:

1. A manufacturing method of a semiconductor device, comprising the steps of:

(a) forming a first semiconductor layer of a first electric conduction type over a main surface of a semiconductor substrate of the first electric conduction type;

(b) forming a second semiconductor layer of a second electric conduction type in the first semiconductor layer by introducing impurities of the second electric conduction type of a polarity contrary to the first electric conduction type;

(c) in the main surface of the semiconductor substrate, forming a first groove portion which penetrates the second semiconductor layer in a first area, and forming a second groove portion which penetrates the second semiconductor layer in a second area;

(d) forming a first insulation film in the first groove portion and in the second groove portion;

(e) after step (d), forming a first conductivity film over the semiconductor substrate, and embedding the first groove portion and the second groove portion by the first conductivity film;

(f) after step (e), removing the first conductivity film which forms out of the first groove portion for a first depth from an opening of the first groove portion in the first area, and leaving the first conductivity film which embeds the second groove portion and the first conductivity film which extends and exists in determined amount out of the second groove in the second area, wherein in the step (f), a third groove portion is formed in a part of the first conductivity film extending and existing out of the second groove portion in the second area;

(g) forming a third semiconductor layer of the first electric conduction type in the second semiconductor layer which adjoins the first groove portion by introducing impurities of the first electric conduction type into the second semiconductor layer of the first area;

(h) after the step (g), forming a second insulation film over the semiconductor substrate so such that the second insulation film embeds the first depth of the first groove portion in the first area and forms over the first conductivity film extending and existing out of the second groove portion in the second area, wherein in the step (h), the third groove portion is embedded with the second insulation film;

(i) after the step (h), removing the second insulation film which forms out of the first groove portion in the first area, and removing a part of the second insulation film which forms over the first conductivity film extending and existing out of the second groove portion in the second area and forming a first opening that reaches the first conductivity film extending and existing out of the second groove portion in the second area; and (j) after the step (i), forming a first wiring electrically connected to the third semiconductor layer over the semiconductor substrate of the first area, and forming a second wiring electrically connected to the first conductivity film under the first opening over the semiconductor substrate of the second area;

wherein in the first area, the first semiconductor layer is a drain, the second semiconductor layer is a channel, and the third semiconductor layer is a source.

2. A manufacturing method of a semiconductor device according to claim 1, wherein
the third groove portion is formed so that it may become a same volume as a volume of the first groove portion over the first conductivity film.

3. A manufacturing method of a semiconductor device according to claim 2, wherein
a depth of the third groove portion is more than or equal to the first depth.

4. A manufacturing method of a semiconductor device according to claim 1, wherein
the first groove portion is formed so that two or more grooves of the first groove potion may be arranged in a first section of the semiconductor substrate in a first direction that intersects a direction which the first groove portion extends and exists;
the third groove portion is formed so that two or more grooves of the third groove portion may be arranged;
the width of the first groove portion and the width of the third groove portion are formed to become the same; and
in the first section, an interval of adjoining the first groove portions and an interval of adjoining the third groove portions are formed to become the same.

5. A manufacturing method of a semiconductor device according to claim 1, wherein
in plane form, the third groove portion is formed so that a direction which the first opening extends and exists may be intersected.

6. A manufacturing method of a semiconductor device according to claim 1, wherein
the third groove portion is formed so that plane form may be surrounded by the first conductivity film.

7. A manufacturing method of a semiconductor device according to claim 6, wherein
the third groove portion is formed so that plane form may become circular.

8. A manufacturing method of a semiconductor device according to claim 1, wherein
the first conductivity film is a gate.

9. A manufacturing method of a semiconductor device according to claim 1, wherein the first opening is formed over the third groove portion.

10. A manufacturing method of a semiconductor device according to claim 1, wherein in the second area, the first conductivity film is extending toward an opposite side to the first area.

* * * * *